United States Patent [19]
Cray

[11] Patent Number: 4,965,863
[45] Date of Patent: Oct. 23, 1990

[54] GALLIUM ARSENIDE DEPLETION MADE MESFIT LOGIC CELL

[75] Inventor: Seymour R. Cray, Chippewa Falls, Wis.

[73] Assignee: Cray Computer Corporation, Colorado Springs, Colo.

[21] Appl. No.: 104,758

[22] Filed: Oct. 2, 1987

[51] Int. Cl.$^5$ .............................. H03K 19/017
[52] U.S. Cl. ................. 307/450; 307/303.2; 307/448; 307/468; 357/45
[58] Field of Search ............... 307/443, 448, 450, 481, 307/468, 303.2, 465, 303.1; 364/491, 489–490; 357/45

[56] References Cited

U.S. PATENT DOCUMENTS

| | | | |
|---|---|---|---|
| 3,417,249 | 12/1968 | Akmenkains | 250/217 |
| 3,654,485 | 4/1972 | Lotz | 307/482 X |
| 3,656,007 | 4/1972 | Murray | 307/262 |
| 3,714,460 | 1/1973 | Clemetson et al. | 307/282 |
| 3,810,128 | 5/1974 | Maser | 340/173 R |
| 3,909,745 | 9/1975 | Dye | 331/945 |
| 4,100,430 | 1/1978 | Lesser | 307/453 X |
| 4,190,778 | 2/1980 | Krause | 307/254 |
| 4,295,225 | 10/1981 | Pan | 455/601 |
| 4,369,371 | 1/1983 | Hara et al. | 250/551 |
| 4,375,677 | 3/1983 | Schuermeyer | 365/154 |
| 4,393,315 | 7/1983 | Stickel et al. | 307/264 |
| 4,404,480 | 9/1983 | Ransom et al. | 307/448 X |
| 4,410,815 | 10/1983 | Ransom et al. | 307/475 |
| 4,435,846 | 3/1984 | Weise | 495/253 |
| 4,438,351 | 3/1984 | Schuermeyer | 307/450 |
| 4,450,369 | 5/1984 | Schuermeyer | 307/450 |
| 4,488,064 | 12/1984 | Vance | 307/297 |
| 4,496,856 | 1/1985 | Ransom et al. | 307/475 |
| 4,496,908 | 1/1985 | Takano et al. | 330/277 |
| 4,506,151 | 3/1985 | MacDonald et al. | 250/213 |
| 4,514,649 | 4/1985 | Nazillat et al. | 307/450 |
| 4,545,078 | 10/1985 | Wiedeburg | 455/600 |
| 4,549,197 | 10/1985 | Brehm et al. | 357/41 |
| 4,553,108 | 11/1985 | Young | 330/300 |
| 4,558,135 | 12/1985 | White et al. | 307/450 |
| 4,590,393 | 5/1986 | Ranson et al. | 307/471 |
| 4,595,881 | 6/1986 | Kennan | 330/54 |
| 4,605,866 | 8/1986 | Conn | 307/296 R |
| 4,616,189 | 10/1986 | Pengue, Jr. | 330/253 |
| 4,623,801 | 11/1986 | Rocchi | 307/272 |
| 4,626,802 | 12/1986 | Gailus | 331/117 E |
| 4,636,654 | 1/1987 | Lach | 307/260 |
| 4,638,188 | 6/1987 | Crey | 307/481 X |
| 4,638,190 | 1/1987 | Hwang et al. | 307/512 |

(List continued on next page.)

OTHER PUBLICATIONS

*Basic VLSI Design Systems and Circuits*, D. Pucknell et al, Prentice Hall (2d Ed.), copyright 1988.
*Basic Computer Logic*, John R. Scott, Lexington Books, Lexington, MA, Feb. 1982.

*Primary Examiner*—David Hudspeth

[57] ABSTRACT

A gallium arsenide logic design system is described for designing custom or semi-custom LSI integrated circuits using standard cells from a cell library. D-MESFET transistors and Schottky diodes are used for implementing the cell types in gallium arsenide to produce performance levels of less than 150 pico-second per gate propagation delay. Each integrated circuit die is built from a cell library containing three standard cells. The limitation on the number of standard cells used for logic design allows for fast and efficient turnaround time between logic design and fabrication. A minumum number of masks are required for implementing the custom integrated circuit due to the efficient design of the cell types. The placement and interconnect of the cells on the die are also performed in an efficient manner due to the predefined allowable locations for cell placement and the predefined allowable route channels for the interconnect. A clock amplifier cell is described for the cell library which differentially phase corrects a two-phase clock signal to ensure that the two clock lines are perfectly out of phase at all times. The combination of this strictly controlled two-phase clock with the gallium arsenide cell designs allows digital logic implementations at an LSI level to operate at 1-GHz clock frequencies.

20 Claims, 14 Drawing Sheets

Level A - Light Implant

Level B - Heavy Implant

Level C - Ohmic Metal

Level D - First Layer Metal

Design Of 1.6 Micron Current Source

U.S. PATENT DOCUMENTS

| | | | |
|---|---|---|---|
| 4,639,621 | 1/1987 | Ikawa et al. | 307/450 |
| 4,644,189 | 2/1987 | Gabillard | 307/449 |
| 4,646,028 | 2/1987 | Palmer | 330/277 |
| 4,649,411 | 3/1987 | Birritella | 357/36 |
| 4,651,333 | 3/1987 | Cappon | 307/481 X |
| 4,654,547 | 3/1987 | Shaver | 307/450 |
| 4,656,371 | 4/1987 | Binet et al. | 307/362 |
| 4,661,725 | 4/1987 | Chantepie | 307/450 |
| 4,661,801 | 4/1987 | Chen et al. | 340/347 |
| 4,663,543 | 5/1987 | Sitch | 307/450 |
| 4,663,596 | 5/1987 | Heeks | 330/4.3 |
| 4,665,508 | 5/1987 | Chang | 365/208 |
| 4,680,484 | 7/1987 | Saunders | 307/448 |
| 4,680,727 | 7/1987 | White | 364/754 |
| 4,686,451 | 8/1987 | Li et al. | 323/313 |
| 4,688,267 | 8/1987 | Chown et al. | 455/619 |
| 4,696,532 | 9/1987 | Albaes et al. | 350/96.19 |
| 4,701,643 | 10/1987 | Laude et al. | 307/450 |
| 4,703,471 | 10/1987 | Fitelson et al. | 370/1 |
| 4,705,967 | 11/1987 | Vasile | 307/304 |
| 4,707,622 | 11/1987 | Takao et al. | 307/448 |
| 4,707,808 | 11/1987 | Heimbigner | 365/182 |
| 4,712,023 | 12/1987 | Otsuki et al. | 307/448 X |
| 4,713,559 | 12/1987 | Vu et al. | 307/446 |
| 4,720,685 | 1/1988 | Garuts | 330/149 |
| 4,724,342 | 2/1988 | Sato et al. | 307/450 |
| 4,725,743 | 2/1988 | Anderson | 307/450 |
| 4,728,819 | 3/1988 | Vu | 307/353 |
| 4,728,821 | 3/1988 | Yang et al. | 307/448 |
| 4,743,782 | 5/1988 | Nelson et al. | 307/475 |
| 4,745,449 | 5/1988 | Chang et al. | 357/23.1 |
| 4,757,478 | 7/1988 | Ducourant et al. | 365/230 |
| 4,763,327 | 8/1988 | Fontaine et al. | 370/112 |
| 4,764,897 | 8/1988 | Kameyama | 365/154 |
| 4,771,189 | 9/1988 | Noufer | 307/448 |
| 4,789,798 | 12/1988 | Lach | 307/475 |
| 4,798,972 | 1/1989 | Melanson et al. | 307/448 X |
| 4,798,978 | 1/1989 | Lee et al. | 307/450 |
| 4,798,979 | 1/1989 | Lee et al. | 307/448 X |
| 4,806,803 | 2/1989 | Yamashita | 307/571 |
| 4,808,851 | 2/1989 | Chantepie | 307/450 |
| 4,812,676 | 3/1989 | Yang et al. | 307/290 |
| 4,831,286 | 5/1989 | Garcia et al. | 307/480 |
| 4,845,681 | 7/1989 | Vu et al. | 365/230.08 |
| 4,856,032 | 2/1989 | Klekotka et al. | 377/477 |

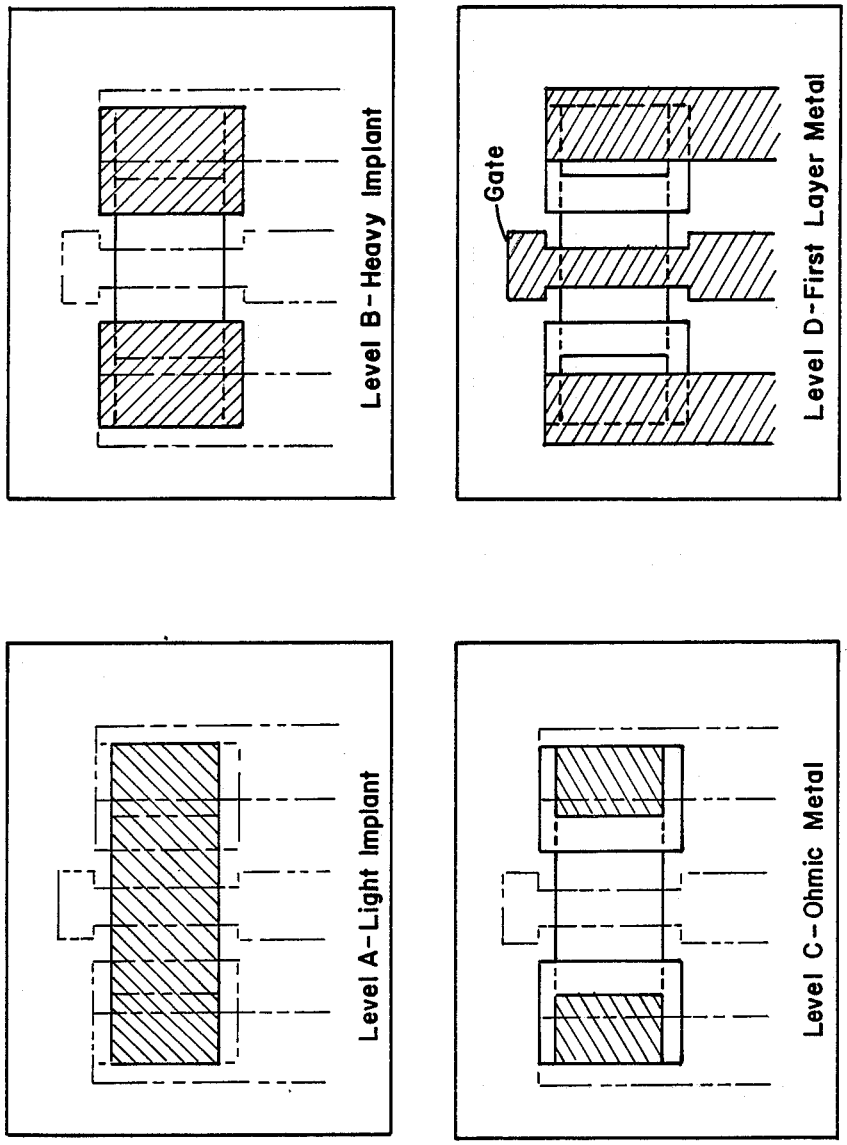
FIG. 1 Design Of 2.4 Micron Transistor

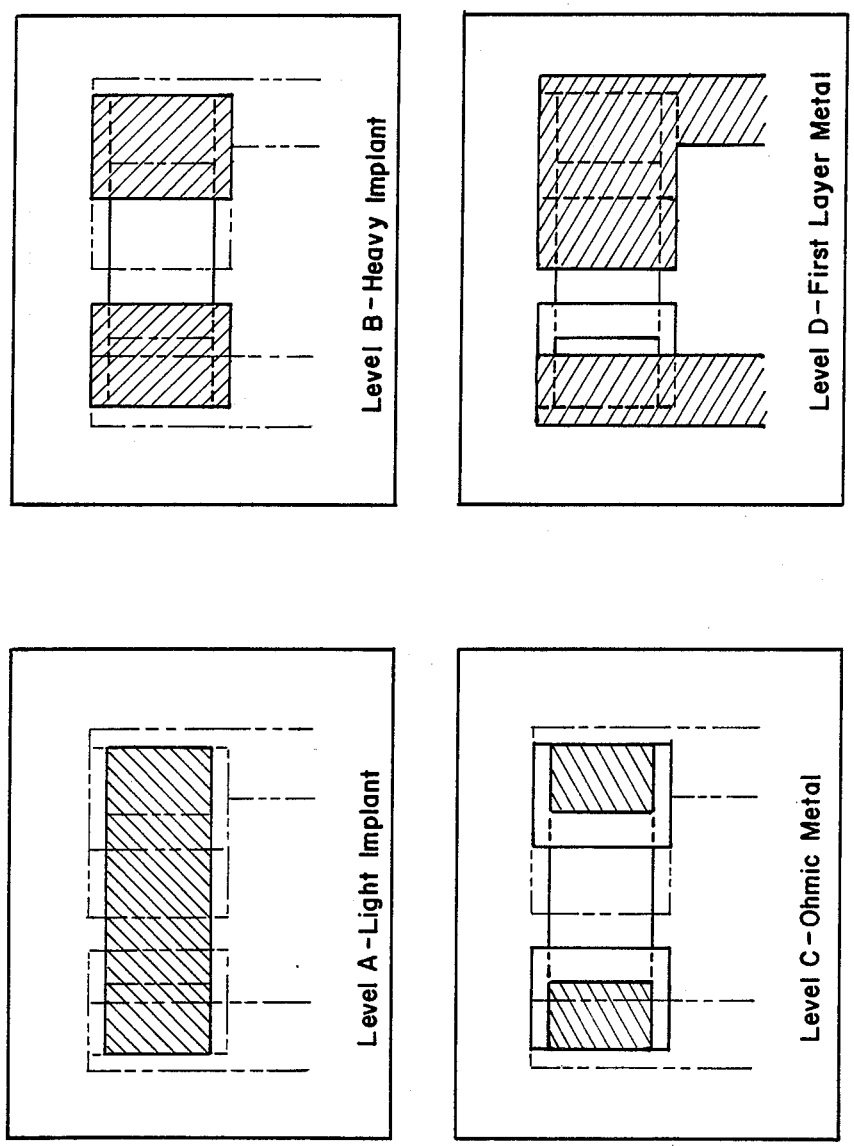

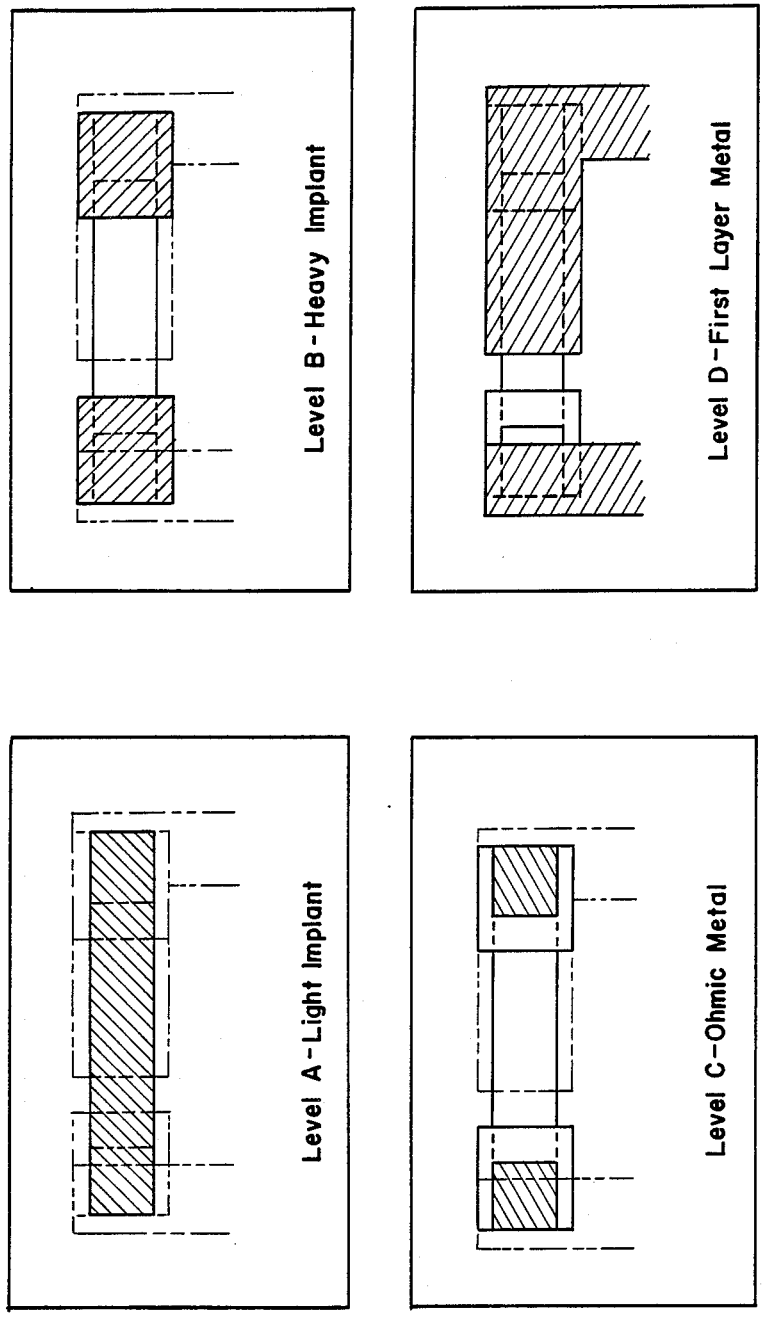
FIG. 3 Design Of 1.6 Micron Current Source

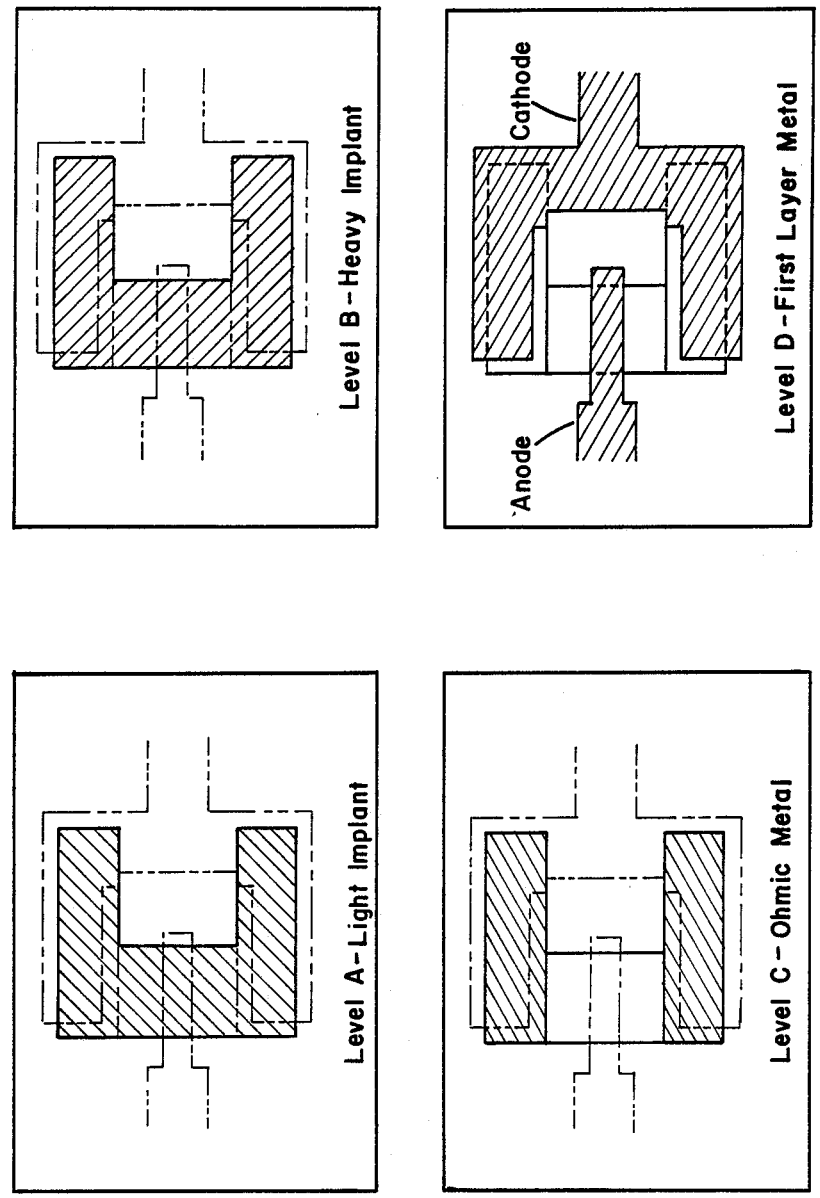
FIG. 4 Design Of 2 Square Micron Type A Diode

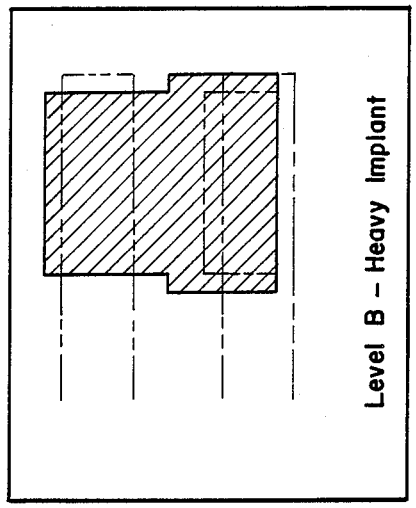
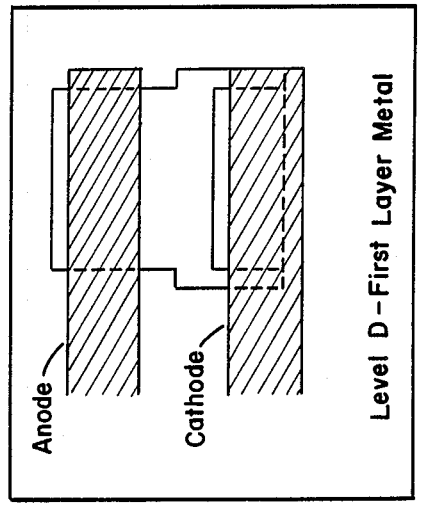
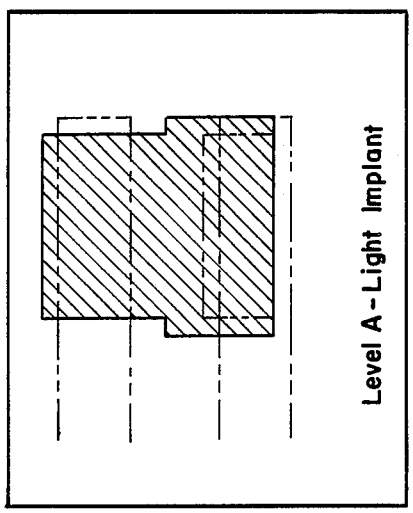
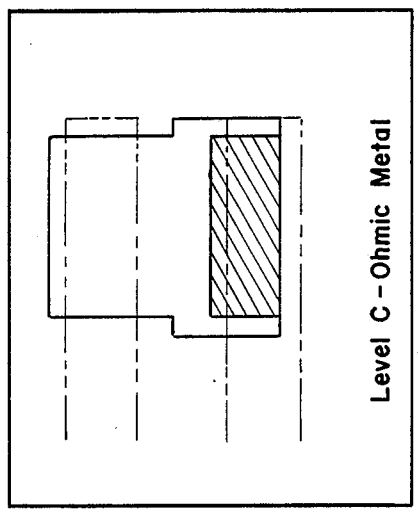
FIG. 5  Design Of 6.4 Square Micron Type B Diode Design Of 17 Square Micron Capacitor Transistor Electrical Characteristics Diode Electrical Characteristics Capacity In Femtofarads Per Square Micron Voltage Across Capacitor Capacitor Electrical Characteristics Logic Package Block Diagrams FIG. 12  Cell Type D Circuit Schematic Cell Type E Circuit Schematic Cell Type F Circuit Schematic Cell Type CA (Clock Amplifier) Circuit Schematic Type D Cell Configured As A Latch Phase—Corrected Differential Clock
For On-Chip Clocking Of Latches

GALLIUM ARSENIDE DEPLETION MADE MESFIT LOGIC CELL

FIELD OF THE INVENTION

This invention pertains to the field of electronic digital computers, and specifically to improved high speed electronic circuitry for computers.

BACKGROUND OF THE PRIOR ART

A considerable amount of effort has gone into the development of gallium arsenide as an alternative semiconductor material for high-speed digital computers, because of its known advantage in gate switching speed over silicon-based integrated circuits. However, despite this switching speed advantage, gallium arsenide has not achieved widespread use. Although there are many reasons for the less than rapid acceptance of gallium arsenide in the semiconductor industry, one reason of particular importance in the field of large high-speed digital computers, or supercomputers, is the lack of effective systems for implementing custom or semi-custom gallium arsenide-based integrated circuits which are needed because of custom design requirements for various sections within the architecture of the computer system. Off-the-shelf small-scale integration of gallium arsenide is available in the prior art and can be used for implementing custom designs of supercomputers. However, the relatively small number of logic gates per package limits the overall performance of the computer due to propagation delays between packages. Hence, any speed improvement in gate switching speed over silicon is at least partially lost in the interpackage propagation delays. In the meantime, silicon-based integrated circuit technology has continued to evolve and has provided increased performance through improvements in packaging density and large-scale integration techniques. Attempts to translate the circuit designs and integration techniques which have been successful in silicon into the field of gallium arsenide has not been successful in application to the design of large computing systems.

Therefore, there exists a need in the high-speed computer industry for a simple and effective design system for implementing custom or semi-custom gallium arsenide-based integrated circuits. Due to the unique characteristcs of gallium arsenide semiconducting materials and the differences between these materials and silicon, unique constraints and requirements are placed on a gallium arsenide-based logic system heretofore unknown in the prior art. Such a logic design system should allow the fabrication of integrated circuits with packaging densities of equivalent gates per chip at a much higher level than currently available in the prior art. Such a logic design system should also be simple and easy to maintain by having a minimum number of cell types to choose from, keeping the number of fabrication steps and cell masks required for implementation at a minimum.

SUMMARY OF THE INVENTION

The present invention overcomes these and other limitations of the prior art by describing a design system for implementing high speed gallium arsenide integrated circuits in a custom or semicustom fashion for use in high speed digital computers. Performance levels of less than 200 picoseconds per gate propagation delay are achieved using a custom gallium arsenide integrated circuit logic cell approach to building each custom integrated circuit. Each integrated circuit die is built from a cell library which results in a package (die) containing 40 to 80 multi-level logic cells equivalent to 200 to 300 gallium arsenide logic gates. A standard approach to implementing the integrated circuits results in efficient and fast turnaround to allow logic designers to test the design actually implemented in the integrated circuits. The gallium arsenide integrated circuits implemented using the preferred embodiment of the present invention are based on a low voltage D-MESFET technology and are fabricated using a minimum number of fabrication steps and only four cell types.

Accordingly, the present invention describes number of gallium arsenide cell types for performing logic functions which can be used as building blocks for constructing larger custom digital logic designs. By using a minimum number of simple cell types to construct larger logical decisions, a minimum amount of mask types and fabrication steps are necessary for constructing a gallium arsenide custom integrated circuit.

According to one aspect of the logic design system of the present invention, a gallium arsenide depletion mode MESFET logic cell is described which includes a diode logic section for performing a logical function connected to a voltage level shifter section for providing signal conditioning of the resulting logical decision, connected for driving an amplifier section having load driving transistors for providing the necessary power and voltage excursion to drive other logic cells.

According to another aspect of the logic design system of the present invention, a gallium arsenide integrated circuit is described having a regular, ordered, and predefined placement configuration having the power supply busses being attached to the cells along predefined paths and having the intercell interconnections be confined to other predefined paths. A plurality of the logic cells are placed in predefined locations for connection to the power supply busses and the interconnection paths. First and second level metal interconnect is used to connect ones of the cells with other ones of the cells to form a custom logic function on the integrated circuit.

According to yet another aspect of the logic design system of the present invention, a method of designing gallium arsenide custom LSI integrated circuits is described having the steps of selecting, from a limited number of cell types, the appropriate cells required to implement a logic function. The cells are then placed at selected predefined locations within a regular, ordered configuration. After placement, metallization layers are included to interconnect the cells to perform a custom design logic function.

According to yet another aspect of the logic design system of the present invention, a method for performing a logic function in gallium arsenide is described comprising the steps of performing a logical function using diode logic, level shifting the resulting logical result and buffering the result to produce a higher drive power in the form of a voltage swing for use by other cells.

According to yet another aspect of the logic design system of the present invention, a differential clock amplifier cell is described comprising two identical clock cells connected to perform a differential function on an incoming two-phase split clock signal. Each phase of the clock signal is sent to one of the clock amplifier cells and the clock amplifier cells compare the signals to perform phase correction. The first stage of the clock amplifier is differentially coupled with the opposite cell.

BRIEF DESCRIPTION OF THE DRAWINGS

In the drawings, where like numerals refer to like components throughout the several views, FIG. 1 depicts the four basic steps for the fabrication of a 2.4 micron transistor in gallium arsenide materials.

FIG. 2 depicts the four basic steps for the fabrication of a 2.4 micron current source in gallium arsenide materials.

FIG. 3 depicts the four basic steps for the fabrication of a 1.6 micron current source in gallium arsenide materials.

FIG. 4 depicts the four basic steps for the fabrication of a 2 square micron type A diode in gallium arsenide materials.

FIG. 5 depicts the four basic steps for the fabrication of a 6.4 square micron type B diode in gallium arsenide materials.

DETAILED DESCRIPTION OF THE PREFERRED EMBODIMENT

Figure 6:
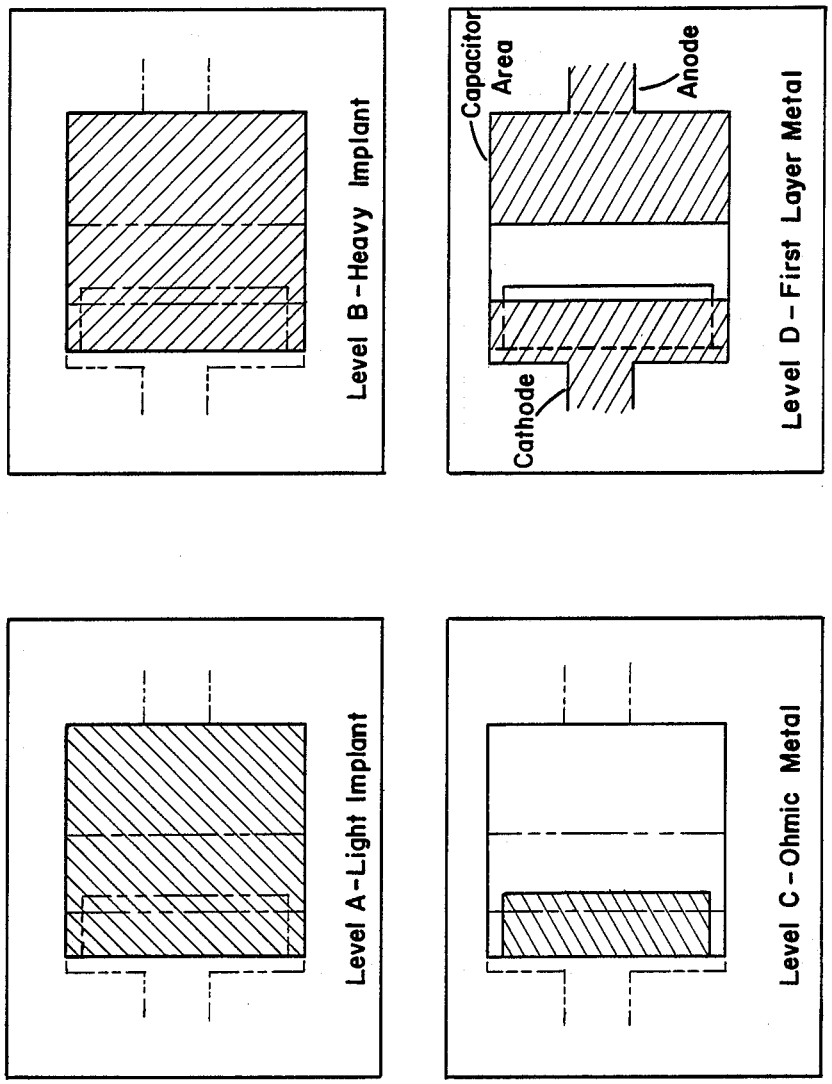
FIG. 6 depicts the four basic steps for the fabrication of a 17 square micron capacitor in gallium arsenide materials.

In the following detailed description of the preferred embodiment, reference is made to the accompanying drawings which form a part hereof, and in which is shown by way of illustration a specific embodiment in which the invention may be practiced. This embodiment is described in sufficient detail to enable those skilled in the art to practice the invention, and it is to be understood that other embodiments may be utilized and that structural changes may be made without departing from the scope of the present invention. The following detailed description is, therefore, not to be taken in a limiting sense, and the scope of the present invention is defined by the appended claims.

The preferred embodiment of the present invention relates to the design of high speed gallium arsenide (GaAs) integrated circuits for use in high speed digital computers. The application of this technology is designed for the speed improvement and enhanced reliability required for modern super computers such as the CRAY-3 manufactured by the assignee of the present invention.

In order to design high speed custom GaAs integrated circuits for use in digital computers, a standard cell approach is used in which a minimum number of cell types are used to construct a larger logic function. The cell types can perform simple AND-OR functions and they can be combined to perform more complex functions or digital latches. In the preferred embodiment, only four basic cell types are used, one of which is a clock amplifier and three of which are similar in design and function. The fabrication of the integrated circuits in GaAs using a minimum number of cell types simplifies the process and increases reliability and yield. The logic system that is intended to be implemented using the preferred embodiment of the present invention is a high speed highly sequential digital computer using a 500 MHz two-phase clock. The clock is distributed throughout the system and is applied to the chip via two signal lines each of which is 180° out of phase of the other. The clock and inverted clock signals are used on-chip for direct control of the sequential latches within the design. Since the latches also perform a logical function on the front end of the latch, 80% of the logic cells in the preferred embodiment of the present invention for use in the CRAY-3 computer manufactured by the assignee of the present invention are clocked cells.

The cell types are described in detail below including the fabrication steps necessary to construct the individual components of each cell. Those skilled in the art, upon reading and understanding the present specification for the preferred embodiment of the present invention will readily recognize the application of these cell types to any desired digital logic function. The logic functions performed and the resulting signal outputs from these chips are compatible with voltage-switch type logic systems (which provide wide noise margins). The result of this GaAs logic design system is a logic cell concentration of approximately 40 to 80 multilevel logic cells combined in a single integrated circuit having an equivalent gate count of approximately 200 to 300 GaAs logic gates. The performance levels of this logic design in GaAs is less than 200 picoseconds per gate delay. In use, the conservative approach to this logic design system produces average fabrication yields of greater than 45% with peak yields in the 75–80% range. The details of fabrication along with the details of construction and use of the logic cells are described in detail below. Also, the method of placing and interconnecting the cells using a standard placement and layout scheme is described which allow maximum flexibility in interconnection of the cells on a single die.

The cells are used as the basic building blocks for the logic design and a total of 40 to 80 logic cells can be used to implement the custom design into a single integrated circuit. The size of the cells which can be fit into a single integrated circuit are described below. Depending upon the cell types used, a fixed number of cells can then be placed onto an integrated circuit. The placement of the cells is in the preferred embodiment done by hand to maximize the routing efficiency between the cells. The allowed location of the cells is described below in connection with the description of the logic package design. Each cell type has a fixed set of patterns or masks which are used to fabricate the individual cells. The fixed patterns or masks for each individual cell are then arranged to form a pattern or mask for the entire integrated circuit according to the placement of the cells as predefined by the manual layout. Metallization masks are also generated to form the custom interconnect between the cells. The steps for creating the individual cell masks for each of the unique cells in the preferred embodiment of the present invention are described in detail below.

GaAs Integrated Circuit Fabrication

The integrated circuits of the preferred embodiment of the present invention are used for processing digital logic and are called gallium arsenide (GaAs) depletion mode metal semiconductor field effect transistor (MESFET) circuits. The GaAs material is grown as a 3" diameter crystal. This material is sawed into wafers which are processed into integrated circuit chips. Transistors and diodes are made on the surface of the GaAs wafer by implanting ions with a linear accelerator to provide a semiconducting path. The resistivity of the GaAs material without implant is very high and is essentially an insulator. Metal layers are then added to the surface for interconnections between the circuit components. Two layers of metal (gold in the preferred embodiment) are used in the integrated circuits of the preferred embodiment of the present invention.

Patterns of implanted areas and patterns of metal layers are placed on the GaAs wafer by coating the wafer with a photosensitive resist and then exposing the resist to a light pattern. The photoresist is chemically removed where the light has changed the photoresist material. The remaining photoresist material is then used as a mask for ion implanting or for metal deposition. Ions are implanted in the wafer by accelerating the ions in a strong electrostatic field and essentially firing them into the wafer surface. The implant is done in a selective manner by using a photoresisted material which will stop the ions before they reach the wafer surface. The openings in the photoresist then select the implant areas as is well known in the art.

Insulating glass layers are applied to the wafer surface to form insulating barriers between metal layers and implant areas and is applied by sputtering. Some of the metal layers are applied to the wafers with sputtering and some with electron beam evaporation. The primary metal used in the preferred fabrication of the preferred embodiment of the present invention is gold because of its good electrical properties and its passive chemical properties. Thin layers of titanium are placed under the gold because titanium is a very sticky metal and helps glue the gold to the previous surface. Other materials may be used in small quantities to form alloys with special properties.

Some of the metal application steps in the fabrication process for the GaAs circuits of the preferred embodiment of the present invention use metal lift-off. This involves placing the pattern photoresist on the wafer surface, first, and then covering the surface with the metal layer. That portion of the metal which is over photoresist is then removed by chemically dissolving the photoresist with the help of ultrasound. The unwanted metal is then lifted off with the photoresist. One of the metal steps described below is too thick for the lift-off technique. In this case the pattern photoresist is applied after the metal and the unwanted metal is essentially machined away by an ion mill. The ion mill involves a plasma of rapidly moving ions which are caused to move perpendicular to the wafer surface by a radio frequency electrical field. The ions then mill away the unwanted metal and the photoresist protects the desired metal.

The machine which does the photolithography in the integrated circuit fabrication process is called a Censor wafer stepper. Censor is the name of the company which developed the photolithography machine. This machine uses glass plates with chromium patterns which are 10 times the linear dimensions of the desired patterns on the GaAs wafers. An ultraviolet light is used to project the image of the glass pattern through a lens onto the wafer. Each of the glass plates correspond to one mask of one of the cell types found in the cell library. The cell type which must be used at a specific cell location on the integrated circuit die is selected by the Censor machine and the specific desired pattern determined according to the placement and layout of the die is projected onto the wafer.

The photolithography machine is called the wafer stepper because the pattern projected on the wafer covers only a small portion of the available surface. The wafer is then moved or stepped and the pattern is repeated. There are 52 pattern projections used in the preferred embodiment of the present invention. The Censor wafer machine aligns the projections onto the wafer by means of alignment marks made on the wafer which are matched to alignment marks on the windows in each mask. When the Censor machine aligns the glass plate and the image onto the wafer, an ultraviolet light is used to expose the photoresist for the current process step being performed.

The process of making the GaAs integrated circuits for the preferred embodiment of the present invention involves six levels of masks in a total of nine steps in the foundary process. The process begins with a silicon nitride cap. This is essentially a thin layer of glass which is used to protect the surface during processing. The glass is sputtered onto the wafer. It is independent of the circuit specific process steps and so it is not included in the process steps listed below.

The first step in the process involves photolithography to create alignment marks on the wafer. These are four marks in the corner of the projection field of the photolithography wafer stepper machine which are used to align later masks in the process. These marks are not circuit specific and the same glass mask can be used for all circuit types.

The second step in the process is a light ion implant, also called the N− implant. This is the implant which makes the semiconducting channels for the transistors. The implant is called light because the energy of the ions is low (80,000 eV) and the ions remain near the surface of the wafer. This is so that the field effect in the transistor will work. Resistivity of this implant is about 1,500 ohms per square micron. The ions used for implantation are silicon with two electrons removed ($Si^{28}$).

The third step in the process is a heavy ion implant, also called the N+ implant. This implant is used to make contacts at the end of the transistor channels and is also used in diode structures. Ions used are silicon as in the case of the light implant but in this case the energy is higher (260,000 eV) and the dose is greater. These ions are driven deeper into the wafer surface. Resistivity of this implant is about 300 ohms per square micron.

At this point in the process, the wafer is annealed. The temperature is raised to about 800° C. for 20 mintues. This causes the silicon ions to find places in the GaAs crystal structure. They become fixed in a substrate and will not escape to the surface.

The fourth step in the process is the addition of ohmic metal. This metal is intended to make a good ohmic contact (low resistance) with the implant in the wafer. In other words, this is the metal connection to the end of an implant channel. This metal is a mixture of gold, germanium and nickel and applied with electron beam evaporation. The metal which is over the photoresist is removed by the lift-off process. The wafer temperature is then raised to about 450° C. for 30 seconds. This causes the newly added metal mixture to form an alloy and bind to the substrate.

The fifth step in the process is called proton isolation. This is an implant of hydrogen ions and is used to damage the GaAs crystal structure in areas where current flow is not wanted. The GaAs substrate has a high resistance, but the orderly structure allows the electrons to drift through the crystal. The proton isolation is to break up this orderly pattern and prevent electron travel.

The sixth step in the process is called first layer metal. This is also called Schottky metal because this metal placed over an implanted area creates a Schottky diode. It is also called gate metal because it forms the gate in a depletion mode MESFET transistor. This metallization is accomplished with electron beam evaporation in which a sequence of metals (titanium, platinum, and then gold) are applied. Unwanted metal is removed by a lift-off process as in the case of ohmic metal.

The seventh step in the integrated circuit process is the addition of inter-level dielectric glass. This is a silicon dioxide glass and is needed to separate the first and second level metal layers. This material is first sputtered onto the wafer and selected areas of the glass are then plasma etched to provide openings where first and second layer metal connections are desired (called vias). The vias are then filled by electron beam evaporation of gold to return the wafer to a planar form. The unwanted metal is removed by the lift-off process and the same photoresist serves for the plasma etch phase and the metal lift-off phase.

The eighth step in the process is the addition of second layer metal. This metal is sputtered onto the wafer and consists of titanium and covered with gold. This metal layer is too thick for a photoresist lift-off process so the metal is applied first and the photoresist second. The photoresist is applied to areas where second layer metal is desired and the undesired metal is then removed by ion milling.

The last step of the process is the addition of silicon nitride glass to protect the surface of the completed circuit. This glass is sputtered onto the wafer and selected areas of the glass are then removed by plasma etching where bonding pad connections are desired for external I/O. This step is not circuit specific because the openings in the passivated glass or bonding pads are the same for all circuit packages.

In the foregoing process, six levels of masks are required. The first and last masks of the set are not unique to the individual circuit and are reused over the entire logic family. The fifth mask is derived from the second and third mask and requires no design. The masks which are unique to the individual circuit designs are assigned a letter designation for each mask level. These letter designations are:

| Level A | Light implant |
| Level B | Heavy implant |
| Level C | Ohmic metal |
| Level D | First layer metal |
| Level E | Via windows |
| Level F | Second layer metal |

Circuit Component Design

FIG. 1 illustrates the design of a 2.4 micron wide transistor for use in the cell designs in the preferred embodiment of the present invention. The individual levels are shaded in each of the first four steps shown in FIG. 1. For simplicity of design and fabrication, only objects which can be made of rectangular structures of regular dimensions are allowed. The drawings shown in FIGS. 1-6 are illustrative only and are not drawn to scale. Phantom lines represent mask areas to be used in later steps of the fabrication process. Dashed lines are used to show lower level objects covered by higher level objects. Solid boundaries reflect areas which lie exposed from a top down view on the surface.

A field effect transistor consists of a source element, a gate element and a drain element. Electrons flow through a semiconducting channel from the source to the drain and a metal gate controls the amount of current which flows through the channel. The design of the 2.4 micron wide transistor illustrated in FIG. 1 shows the source and drain elements as being symmetrical. The drain in this transistor is determined by whichever element has the higher external voltage applied.

The semiconducting channel is illustrated in the upper left drawing in FIG. 1 as the level A or light implant step. The width of the channel is the vertical dimension of the shaded area shown. In this case the channel is 2.4 microns wide which is by definition the width of the transistor. The length of the transistor is the space from the heavy implant on the source side of the gate to the heavy implant on the drain side of the gate as shown in level B. Most transistors used in the cell designs in the preferred embodiment of the present invention have a length of 2.4 microns. Longer channel lengths are occasionally used to reduce the transistor current.

The upper right drawing in FIG. 1 illustrates by shading the areas which are designated as heavy implant. The sheet resistance of heavy implant is 300 ohms per square micron as compared to the sheet resistance of the light implant of 1500 ohms per square micron. This difference in implant resistance essentially terminates the effective transistor channel at the edge of the heavy implant. The light implant must be used under the gate metal because it is close to the surface of the substrate and the proximity allows the gate to function by an electrostatic field effect. Note that the light implant continues the length of the heavy implant and overlaps it. This makes the implant resistance under the ohmic metal as low as possible.

The lower left drawing in FIG. 1 illustrates by shading the areas of the transistor design which have ohmic metal fabricated at level C. The ohmic metal breaks down the substrate surface barrier which would otherwise result in a Schottky diode. These two areas of ohmic metal are essentially the metal terminals of the transistor for the source and drain elements.

The lower right drawing in FIG. 1 illustrates by shading the areas of the transistor design which have first layer metal. The metal paths at the bottom of the drawing are the connections to other portions of the cell. These metal paths are 1.6 microns in width. The gate metal is narrowed as it passes over the light implant channel to reduce the electrical capacity of the gate metal to the channel. This capacity largely determines the speed of the transistor. A large capacitance requires more power to change the gate potential.

The wide area on the far side of the gate finger is insurance that the gate finger is firmly terminated beyond the light implant channel. The actual appearance of the metal in a completed transistor is not the same as in the drawings shown. The sharp corners disappear and external points tend to shrink as a result of photolithography and photoresist lift-off. The end of the gate metal actually appears as a round termination of the finger.

Figure 7:
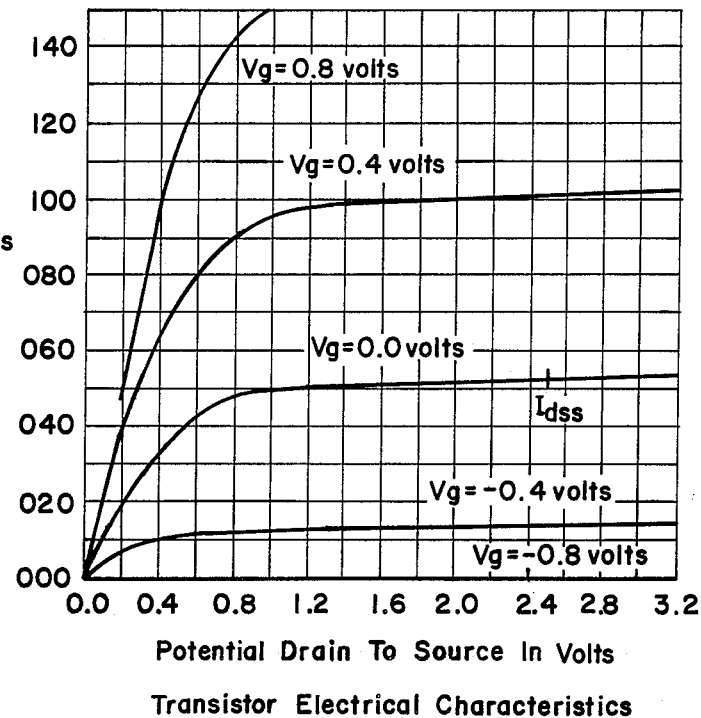
FIG. 7 depicts the transistor electrical characteristics of the 2.4 micron transistor of FIG. 1.

The electrical characteristics of the transistor shown in FIG. 1 is shown in the graph of FIG. 7. The horizontal coordinate is the drain voltage with respect to the source voltage. The vertical coordinate is the amount of current that flows in the drain as a function of drain voltage and gate voltage. The graph shows five plots of drain current versus drain voltage for five constant gate voltages. The curve labeled $V_g=0$ has special significance because this is the curve applicable to transistors used as current sources. This will be described more fully below. The point on this curve where the drain voltage is 2.5 volts has additional significance. The current at this point is chosen as a parametric reference for the amount of current capacity in the transistor. This current value has a special label $I_{dss}$ which stands for the drain current with the gate voltage at the supply voltage.

The gate voltage which causes the drain current to become zero is called the transistor pinch-off voltage. Gate voltages more negative than the pinch-off voltage have no additional effect. There is a relationship between the pinch-off voltage as defined above and the drain voltage which causes the graphs of FIG. 7 to break and become more or less flat. This is approximately at the same voltage value of $-0.7$ volts. Actual values in the preferred embodiment of the present invention may range from $-0.6$ volts to $-0.8$ volts.

The curve labeled $V_g=0.8$ volts in FIG. 7 becomes flat with a drain current of approximately 160 microamperes per micron gate width. This curve is significant because it is the most positive excursion of the gate voltage in the circuit cell applications in the preferred embodiment of the present invention. At this gate voltage, significant gate current flows if the drain voltage is low. The curve is incomplete in the low drain voltage region only for clarity in FIG. 7 since the curve actually passes over the other curves and crosses the zero drain curve axis above zero drain voltage. This is because at zero drain voltage the source and drain are essentially identical and the gate current divides between the two as a diode. The drain current is therefore slightly negative to zero drain voltage.

Current sources are used in the preferred embodiment of the present invention instead of resistors. The current source gives a sharper transition to the electrical signals and is more uniform in parametric values. A current source is essentially a transistor with a gate element tied electrically to the source element. Electrical characteristic of the current source is therefore limited to one of the lines in the graph of FIG. 7. This is the drain current versus drain voltage curve with the gate voltage zero.

The design of a 2.4 micron wide current source is illustrated in FIG. 2. Most of the description of transistor design described above applies to this device as well. The same four drawing types illustrate the four levels of process masks used in the current source design. The only difference between the current source design illustrated and the 2.4 micron transistor design previously described is the connection of gate metal to the source metal. This is best shown in the lower right drawing which shows first layer metal shaded.

A source element metal in a current source design is extended directly over the light implant channel to encompass the position which would be occupied by the gate metal in a transistor design. Note that the gate metal (source metal) now covers the 0.8 micron long light implant gap which was open between source and gate in the transistor design. The average voltage between this metal and the implant beneath it is half the voltage between the metal in the gate area and its respective implant area. This metal coverage reduces the current flow in the implant channel slightly with respect to a transistor which has gate and source connected externally. The amount is about 5% of the nominal currents.

The design of a 1.6 micron current source is illustrated in FIG. 3. This design has a special structure because there are problems in making a 1.6 micron current source in the same manner as the 2.4 micron current source previously described. The problems arise as the light implant channel becomes narrow. The foundary process is not able to control the edges of the implant area well enough to give good uniformity with very narrow implant channels. There are also tolerance problems with the photoresist in these sizes. As a result of these problems, current source designs at or below 1.6 microns in width use an extended channel to reduce the current to the desired value. The 1.6 micron current source illustrated in FIG. 3 has a 1.6 micron wide light implant. The channel length has been extended by 1.6 microns from the length of a normal transistor. The gate (source) metal extension over the light implant area is 3.2 microns long. There are several factors which contributed to the reduction of channel current to the equivalent of a 1.6 micron device. One factor in current reduction for the 1.6 micron current source is the additional resistance of the channel between the gate and source positions. This is one square at 1500 ohms per square micron beyond that resistance normally associated with the transistor. This causes a 75 millivolt drop at the 50 microamperes expected from the current source.

An additional factor in the current reduction is the effect of the metal over the light implant channel for the extended distance. The effect of this metal cover is to increase the effective resistance of the channel by forcing the electron travel deeper in the implant area. This effect increases the average resistance of the extended channel from 1500 ohms to 2500 ohms. Voltage drop is then 125 millivolts instead of the 75 millivolts.

A third factor in reducing the current in the 1.6 micron current source is the net effect of the narrow channel in the foundary process. There is a narrowing effect of the channel width by about 0.15 microns per edge. This results in a 0.3 micron width reduction for the 1.6 micron wide implant channel. This is a 20% reduction for this size channel and it causes a corresponding reduction in channel current.

The three factors described above, when taken together, reduce the current in the 1.6 micron current source from the 80 microamperes, which might be expected from the channel width, to 50 microamperes. This is the nominal value for a 1.6 micron device.

Diodes are easy to fabricate in GaAs. Whenever a first layer metal passes over an implanted area of the substrate, a Schottky diode is formed. The electrical characteristics of the diode depend on the size of the overlapping area and the resistance of the implant path to an ohmic contact. There are two styles of diode configurations used in the cell designs of the preferred embodiment of the present invention. These are labeled type A diodes and type B diodes. The type A diode has a path resistance of 200 ohms per square micron of diode area. The type B diode has a path resistance of 1000 per square micron of diode area. The type A diode is used exclusively as a logic forming input device for cell structures as described below. The type B diode is used for level shifting and clamping functions in the cells.

The design of a type A. diode is illustrated in the four drawings of FIG. 4. These drawings are the same as the previous fabrication mask drawings described above. The anode of the diode is the small metal finger with an external connection from the left in the drawing for level D. The cathode is the larger surrounding metal with an external connection to the right. The contact area of the diode is that portion of the anode finger which is over the implant field. This is a rectangular area 0.8 microns by 2.4 microns in size. The total area is approximately 2 square microns. Note that the two implant fields are identical. This is important in diode design because the light implant is near the surface of the substrate and the heavy implant is deep in the substrate. The surface implant is necessary for a good diode characteristic and the deep implant is necessary to minimize the resistance from the diode area to the ohmic contact. There is an ohmic contact on each side of the anode finger. This design is aimed at a configuration with minimum diode resistance per unit area. The price paid for this feature is considerable die real estate and process yield loss from close spacing.

A type B diode with a 6.4 square micron diode contact area is shown in FIG. 5. These dimensions are considerably more relaxed than the dimensions for the type A diode described above. The anode finger for this configuration in FIG. 5 is the top metal path in the drawing for level D. The cathode is the lower metal path also in level D. The area of the diode in this configuration is 4.0 microns by 1.6 microns.

The implant areas are identical in this design as they were in the design of the type A diode shown in FIG. 4. There is a single ohmic contact area in the type B diode. This is spaced farther from the anode than in the type A design. The additional spacing plus the wider anode finger makes the resistance of this diode design five times that of the type A diode. The advantage of the type B diode is the better process yield in the greater diode area in a given amount of real estate. The type B diode has a contact area of more than three times that of the type A diode in a slightly smaller real estate area.

Figure 8:
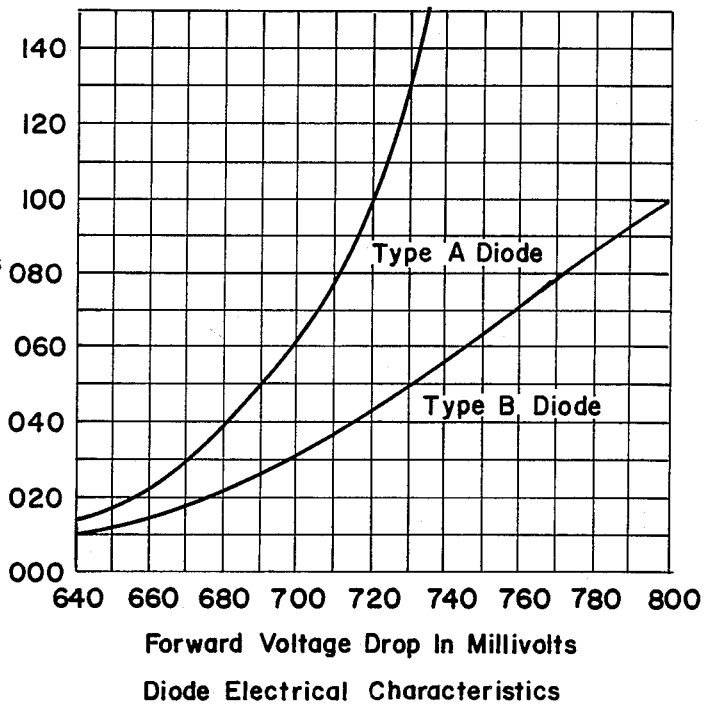
FIG. 8 depicts the diode electrical characteristics of the type A and B diodes shown in FIGS. 4 and 5 respectively.

The type A and type B diodes have different electrical characteristics as the result of the difference in resistance to the ohmic contact. Plots of the forward voltage drop versus forward current are shown in FIG. 8 describing the diode electrical characteristics. The type B diode curve is approaching a straight line toward the left of the chart of FIG. 8. This is because the 1000 ohm forward resistance of the diode is dominating the electrical characteristics in this current range.

The type A diode has a much steeper curve in the voltage and current ranges shown. The type A diode curve is just beginning to straighten at the top of the chart of FIG. 8. This slope represents the forward resistance of 200 ohms. Both curves reflect an underlying exponential component which becomes resistive when the current is high enough.

If the diode characteristic curves were continued for lower voltage drops, they would essentially merge near the left edge of the present chart of FIG. 8. Both diode types would drop about 600 millivolts with a 5 microampere forward current and would drop about 580 millivolts with a 2 microampere forward current. The curves are exponential in this region.

Another attribute of the diodes of interest in cell design in the preferred embodiment of the present invention is the reverse bias capacitance. This is the loading factor, particularly for the cell input diodes (described below) in switching state from one voltage level to another. The same information is applicable to the type A and type B diodes.

Capacitors are formed from large contact area diodes with the application such that the potential across the diode is always reversed from that which would cause diode forward current. A design for a 17 square micron capacitor is illustrated in the drawings of FIG. 6. Most capacitors used in the preferred embodiment of the cell designs of the present invention are much larger, usually several hundred square microns to several thousand square microns. The basic structure is the same as for the small capacitor illustrated in FIG. 6.

The capacitor illustrated in FIG. 6 can also be viewed as a diode. The drawing for level D shows the external connections for the device. The anode of this device, viewed as a diode, is on the right side of the drawing for level D. The cathode is on the left side of the drawing for level D shown in FIG. 6. This drawing is reversed with respect to the diode drawings because the device is used with reverse polarity with respect to a diode. The left connection is always positive with respect to the right connection when used as a capacitor. The contact area for the capacitor is the contact area under the diode anode.

Figure 9:
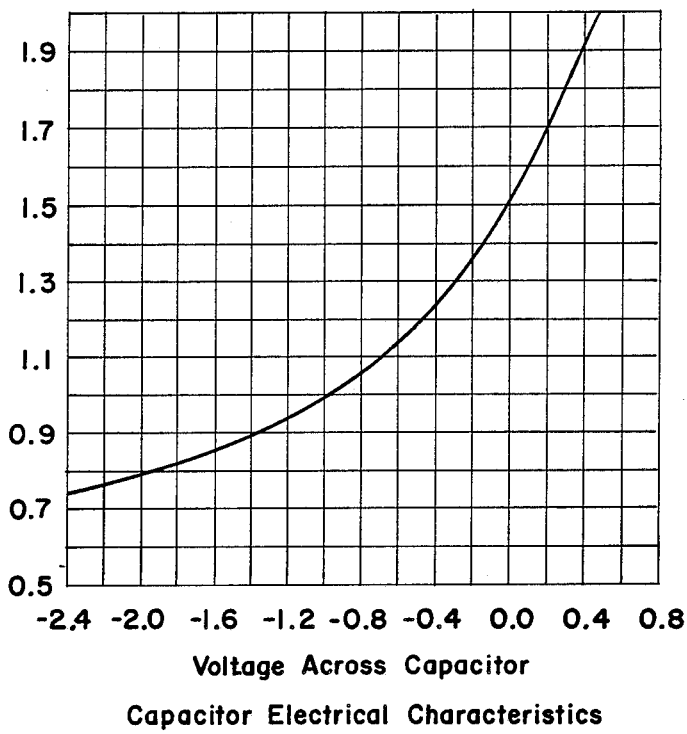
FIG. 9 depicts the capacitor electrical characteristics of the capacitor type shown in FIG. 6.

The electrical characteristics of the capacitor are shown in FIG. 9. The capacity per square micron on the vertical axis is the small signal incremental capacity for the given operating voltage. The voltages shown on the bottom of the chart are as viewed by a diode. That is, a positive voltage causes conduction and is generally not desired for a capacitor application. There are two capacitor applications common in the cell designs of the preferred embodiment of the present invention. One has a negative operating point of about −0.7 volts and the other a negative operating point of about −1.4 volts.

The series resistance of the implant area must be considered in capacitor design. The 250 ohms per square micron of resistance can become a design factor as the capacitor becomes quite large. This effect is minimized in the design by breaking up the capacitor contact area into smaller pieces and providing metal interconnections between the pieces.

The electrical characteristics of the capacitor are appropriate for analyzing the input capacity of a transistor gate. In this case, the voltage excursion is from −1.1 volts to +0.7 volts. The capacitor is very nonlinear over this range and the excursion rate is greatly retarded in the positive gate voltage region as a result of the capacity. The electrical characteristics of the capacitor are also appropriate for analyzing the input capacity of a type A diode for cell input loading. In this case, the voltage excursion is from −1.2 volts to +0.8 volts. Again the capacitor nonlinear characteristics greatly affect the voltage transition rate.

The Logic Package (Die) Design

The logic package in the design of a computer system using the logic cells described herein is a GaAs integrated circuit die. The die is approximately 150 mils by 150 mils by 7 mils thick. It contains electrical circuits to perform the computer logic functions and to communicate with other logic packages in a computer system. The average power dissipation of a logic package die is 800 milliwatts. The level of integration represented by the package is equivalent to a 500 gate silicon emitter coupled logic package. The speed of the circuits is less than or equal to a 200-picosecond single gate delay.

The logic packages described above do not use emitter coupled logic nor do they use transistor gates of the type used in high speed silicon circuits. The circuits used in the cell designs of the preferred embodiment of the present invention involved two levels of diode logic followed by either two or three levels of inverting amplifiers. A block diagram of this representation of two circuit cell types is shown in FIG. 10.

Signal voltage levels in the cells of the logic circuits of the preferred embodiment of the present invention are similar to and compatible with single output, voltage switching logic levels in silicon circuits. A low voltage level of 400 millivolts with respect to ground is considered the static ONE state. A high voltage level of 2400 millivolts with respect to ground is considered the static ZERO state. The circuit threshold voltage is about 1400 millivolts. This voltage switching type of logic results in a fairly high noise margin in a high speed GaAs environment.

A custom logic package design is divided into a number of standard cells which are interconnected with metal paths to form the desired logical function within the integrated circuit. The standard cells are taken from a cell library containing four cell types used throughout the logic design. The two most common cell types available for use in constructing a logic package in the preferred embodiment of the present invention are the type D cell and the type E cell shown in block diagram form in FIG. 10. These are the two cell types which are used for logic generation within the package design where the outputs of the cells are used internal to the package (GaAs die). The cell type which drives transmission paths outside of the integrated circuit package are called type F cells and are described below.

Figure 10:
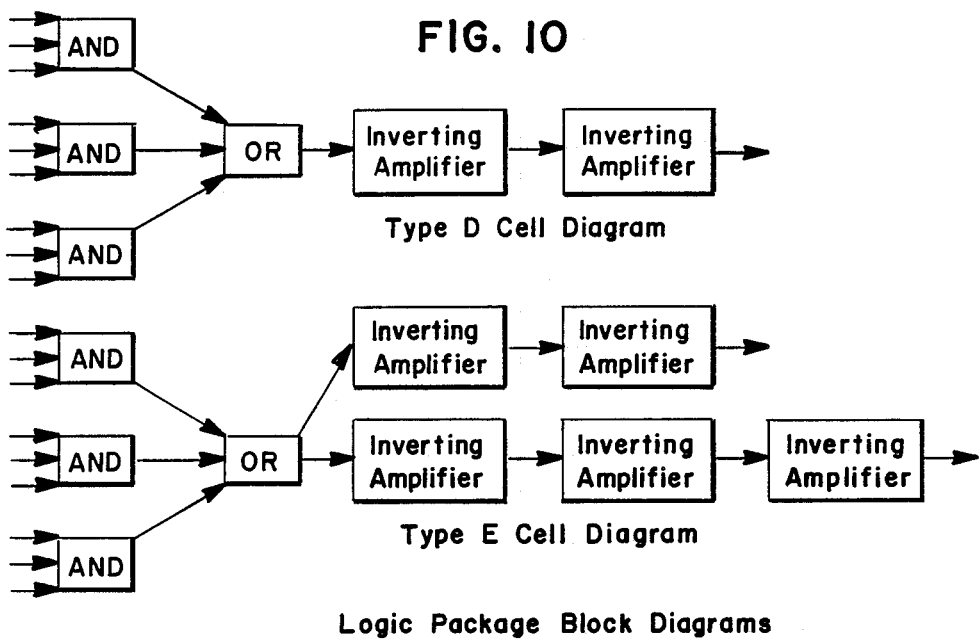
FIG. 10 depicts the logic package block diagrams for a type D and type E cell.

The logic functions illustrated in FIG. 10 are called 3×3 diode logic. This means that each of the AND circuits may have three input signals and there may be three such circuits with inputs to the common OR circuit. This is the average level of complexity in the logic cells used in the preferred embodiment of the present invention. The maximum depth of logic allowed by the cell designs is 5×5 diode logic. Each cell type has a number of diode configurations which will be defined below in the description of the logic package cell library.

The type D cells amplify and shape the signal resulting from the diode logic network. The output is double inverted and is able to drive six internal static loads within the logic package (GaAs die). This cell type is the smallest of the types used in a design and takes half the space of the other cell types. The type E cells amplify and shape the signal resulting from the diode logic network and provide both polarities of output from the cell. This takes twice the power and space of the type D cell but is necessary in generating complimentary signals. Each output is able to drive six internal static loads in the logic package.

Figure 11:
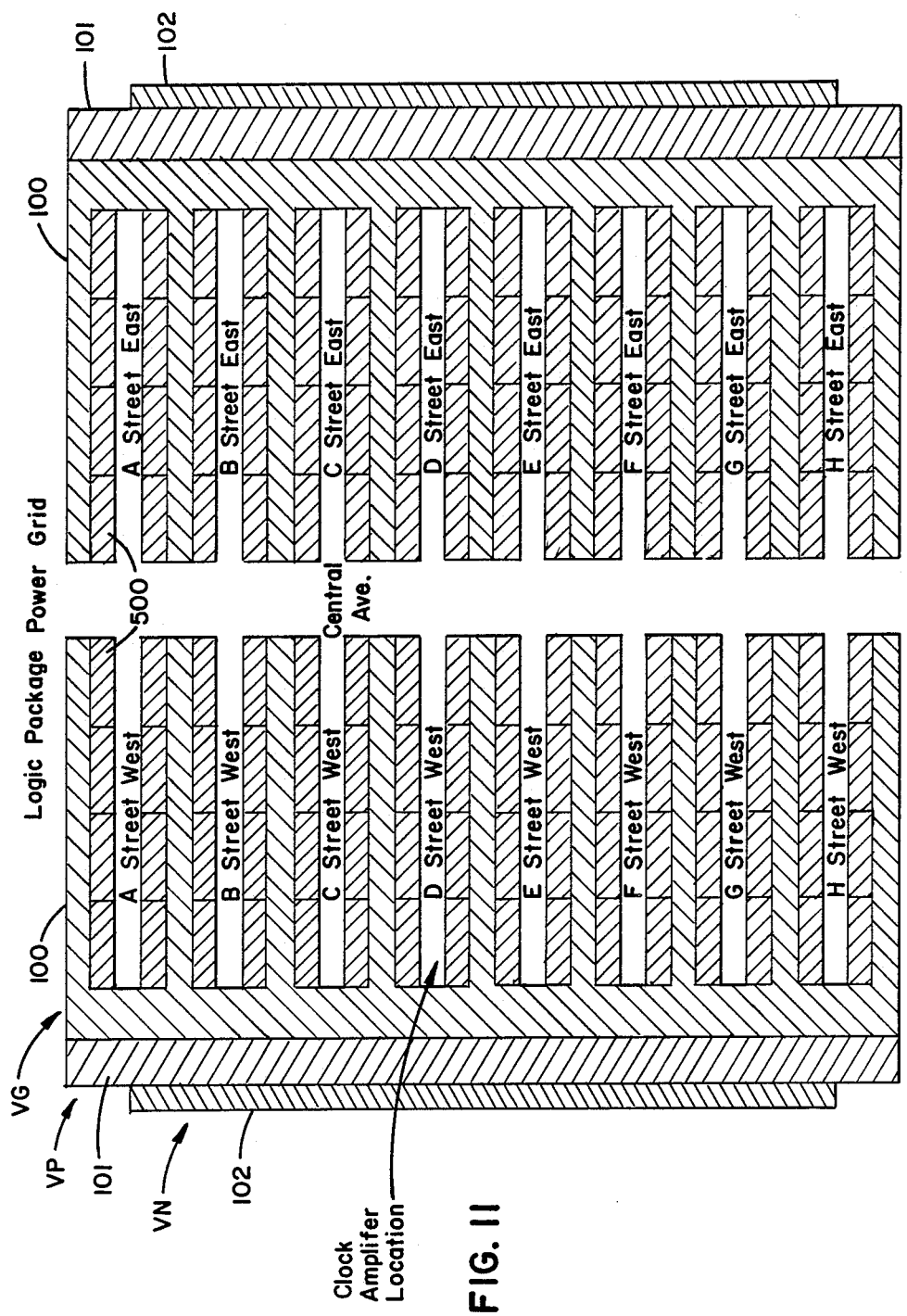
FIG. 11 depicts the allowed locations of cells on the gallium arsenide die along with the signal paths and power distribution paths.

The various logic package cells used in an integrated circuit design using the preferred embodiment of the present invention receive power from the power grid structure which is the same in all package layouts. This structure is illustrated in FIG. 11. There are three power supply paths required for each cell in the package design. The positive voltage (VP) 101 has a value of +3.2 volts with respect to ground. The negative (VN) 102 has a value of −2.0 volts with respect to ground. The third path is the ground connection (VG) 100 for the reference potential. The power distribution paths shown in FIG. 11 illustrate only the first layer metal paths. Second layer metal distributes the VP and VN power supplies to the cell positions. The VP second layer metal completely covers the VG power bus. The VN second layer metal forms a bar which goes down the middle of each interconnect street.

There are 128 positions for package cells in a logic package layout using the preferred layout structure shown in FIG. 11. These positions are illustrated by the shaded small rectangles 500. Interconnections between package cells pass down the streets to central avenue. There are 26 path positions for horizontal lines in each street for interconnection. There are 60 path positions for vertical lines in the central avenue. The intercell interconnections are only allowed to be made on the streets and the central avenue.

There are 52 bonding pads in the preferred embodiment spread around the periphery of the logic package power grid (not shown). Ten of these pads connect to the power grid. Two pads in each corner are connected to VP and VG and two pads on opposite sides of the die are connected to VN. Signal inputs to the logic package travel around the edge of the power grid and enter the central avenue from both the top and from the bottom. Signal outputs from the logic package generally pass over the power grid from the far ends of the streets and connect to bonding pads along the sides of the package.

Cell Design

Figure 12:
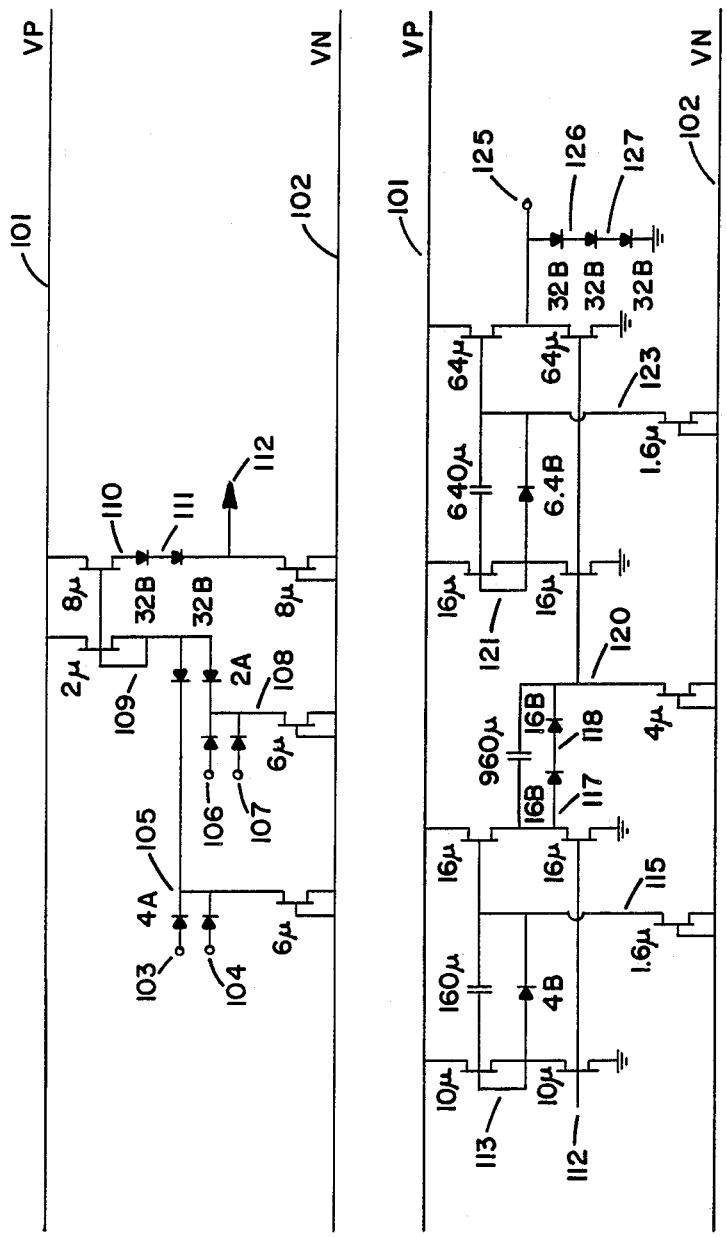
FIG. 12 is a detailed electrical schematic diagram of the cell type D.

A detailed electrical schematic diagram is shown for the type D cell in FIG. 12 using interconnection conventions typically used in describing circuits integrated into semiconductor. The type D package cell is the smallest and has the lowest power of the cell types used in an integrated package design using the cells of the preferred embodiment of the present invention. The type D cell fits into one cell location 500 of the allowed positions shown in FIG. 11. This cell type is used to form two levels of logic and to provide the reshaped and amplified output to other package cells in the integrated circuit. Only the normal output (uncomplimented output) of the diode logic network is provided. The diode network is illustrated in the upper half of the drawing of FIG. 12. The two stages of inverting amplifier are illustrated in the lower half of the drawing. The diode network illustrated has 2×2 logic generation. Those skilled in the art will readily recognize the variations on the diode network which are possible to create other logic functions.

The device sizes for the components are shown in microns near each components. In FIG. 12, only the nodes interconnecting the components are labeled. The width for transistors is shown in microns and the diode area for diodes is shown in square microns. The letter following the device size for diodes indicates the diode configuration type as described above.

The inputs to the diode network are indicated by nodes 103 and 104 for the first AND circuit and the inputs to the second AND circuit are indicated by nodes 105 and 107. There is a maximum total number of cell inputs for the cell types based on a physical space at the street curb using the layout configuration shown in FIG. 11. For the type D cell, a maximum total number of inputs is 13.

A 6 micron current source connected to the VN power supply bus 102 is part of each AND circuit in the diode network. The voltage at node 105 or 108 has a low value of approximately −0.3 volts. This node voltage has a high value of approximately 1.7 volts. This 2 volt signal excursion is a reflection of the input signal excursion with a constant voltage drop because of the input diodes. A node 106 voltage has a low value if and only if all of the input signals in that AND circuit are low.

A 2 micron current source connected to the VP power supply is a part of the OR circuit in the diode network. The voltage at node 109 has a low value of approximately 0.4 volts. This node voltage has a high value of approximately 2.4 volts. This node has a low value if any of the AND circuit nodes has a low value.

The node 109 voltage represents the completed translation of the diode network.

The translated signal voltage at node 109 must be shifted negative to provide an approprite input signal to the first of the inverting amplifiers. This level shift and an associated power amplification is provided by two 8 micron wide transistors and a pair of level shifting diodes. The resulting signal at node 112 has a low voltage of approximately −1.0 volts and a high voltage of approximately 0.8 volts. This signal excursion of 1.8 volts represents a 10 percent compression of the original input signal swing. The compression is due to the non-linear transistor characteristics in the level shifting circuit and the gate current which flows at the positive end of the excursion from the amplifier transistors.

The two stages of inverting amplifiers shown in the lower half of FIG. 12 are very similar in structure. They differ primarily in the sizes of the devices involved. Each amplifier has three parts: an inverting transistor circuit, a level shifting network, and a pair of load driving transistors. There are two 10 micron wide transistors in the first stage inverter circuit. The voltage excursion of node 113 is from a low value of approximately 0.2 volts to a high value of approximately 3.0 volts. This node excursion is in the inverse direction of the node 112 excursion. The threshold of the inverter is defined as that node 112 voltage which results in a node 113 voltage at mid range. The threshold voltage for this inverter is approximately −500 millivolts.

The level shifting network connected to the inverting transistor circuit consists of a 4B diode, a 160 micron capacitor and a 1.6 micron current source connected between node 115 and the VN power supply bus 102. The node 115 voltage resulting from this level shift follows the node 115 voltage with a 600 millivolt negative bias. There is very little signal compression in this circuit because no gate current flows from the driven transistor.

There are two load driving transistors in each inverting amplifier. The upper 16 micron transistor is called a source follower. The lower 16 micron transistor is an inverting driver with a gate voltage taken directly from the input signal 112. The signal excursion at 117 has a low value of approximately 0.2 volts and a high value of approximately 2.4 volts. This signal voltage is driven positive by the upper 16 micron transistor and is driven negative by the lower 16 micron transistor.

The level shifting circuit connects the output of the first inverting amplifier to the input of the second inverting amplifier. This circuit consists of a 960 micron coupling capacitor, two 16B level shifting diodes and a 4 micron current source connected to the VN power supply bus 102. The node 120 output of this circuit has a low voltage of approximately −1.0 volts and a high voltage of approximately 0.8 volts. There is considerable voltage compression in the level shifting circuit because of gate current which flows from the second stage amplifier at the positive end of the voltage excursion.

The second stage of inverting amplifier has essentially the same parts and voltage excursions as the first stage. The output of the second stage is clamped with three 32B (32 square micron) diodes. This is to hold the positive voltage excursion of the two 64 micron output driver transistors. These diodes in effect replace the function that the second stage gate current performed for the first stage output. Total delay through the type D cell from input signal to output signal is approximatley 400 picoseconds.

Figure 13:
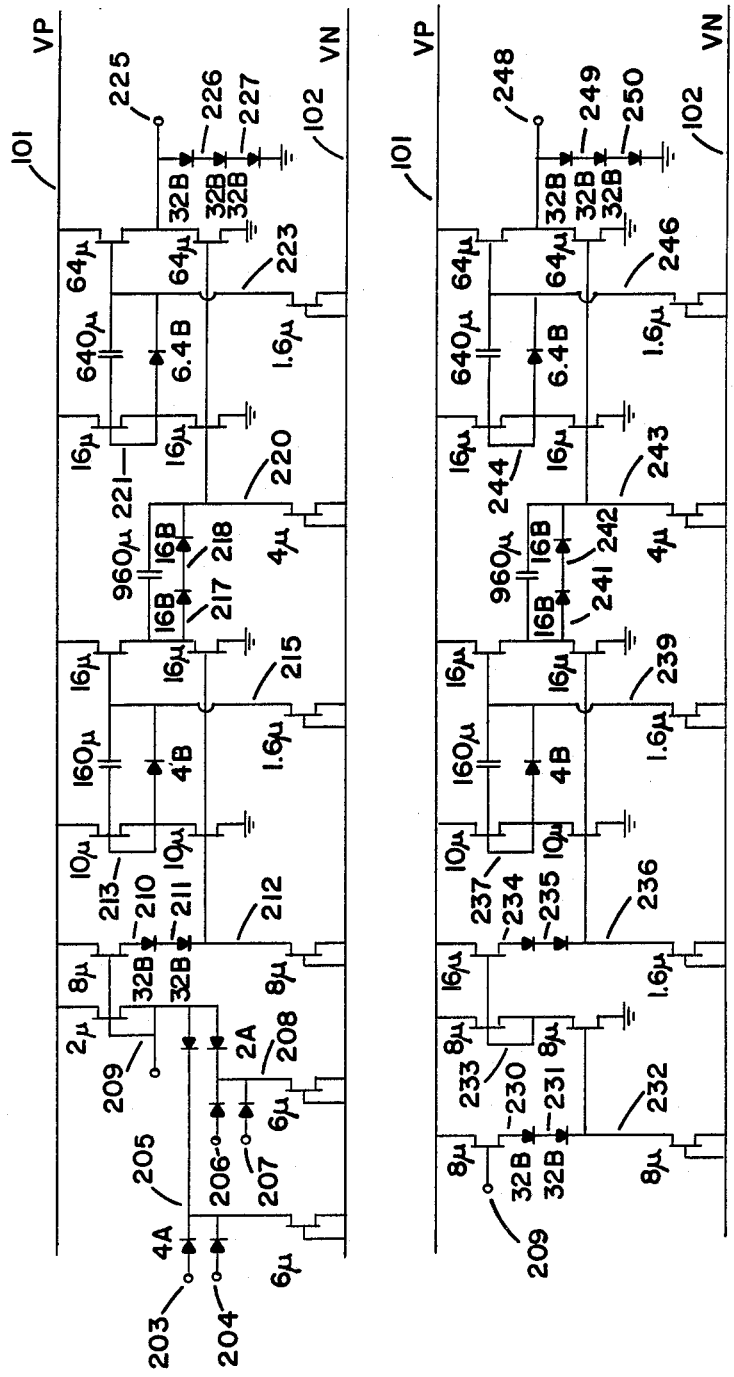
FIG. 13 is an electrical schematic diagram of the cell type E.

The type E package cell is the most versatile of the cell types and is shown in FIG. 13. This cell type translates input signals into two levels of diode logic and provides both normal and complimentary output signals. This cell type requires twice the power and twice the space than type D cell and fits into two cell locations 500 of FIG. 11. One advantage of the larger space is that there is more street curb for input diodes. The maximum number input diodes for the type E cell is 20 as compared the the type D cell maximum of 13. Each signal output from the type E cell can drive six loads internal to the integrated circuit package in the preferred embodiment.

A circuit schematic diagram of the type E cell is shown in FIG. 13 in which the upper half of the drawing illustrates the input diode network and the two inverting amplifiers which provide the normal output of the cell. The lower half of the drawing of FIG. 13 illustrates the three inverting amplifiers which provide the complimentary output of the cell. The circuits in the upper half of the drawing are the same as those previously described for the type D cell.

The node 209 output of the diode translator of FIG. 13 provides an input to both the normal and complimentary amplifier stages and corresponds to node 109 of FIG. 12. Node 232 in the lower drawing corresponds in function and voltage excursion to node 212 in the upper drawing. Note that the last two digits of the node numbers in the upper half of the drawing of FIG. 13 correspond to the last two digits of the node numbers of the type D cell in FIG. 12 and refer to same-function nodes.

The first stage of inverting amplification in the complimentary amplifier path showed in the lower half of FIG. 13 consists of four 8 micron transistor and two 32B level shifting diodes. The two transistors providing the inversion at node 233 are similar to the inverting amplifiers previously described. The level shifting and power amplification function of the remainder of the circuit is similar to the node 212 circuit. Note that the level shifting diodes have a different size relationship to the associated transistors. This is because the node 233 excursion is fed directly into the level shifting circuit and node 236 has a greater range potential than node 212 would have. This potential is not realized because the gate current from the second amplifier stage causes greater compression than the node 212 circuit sees.

The circuit delay through the two paths of the type E cell are not the same. The transmit time thorugh the normal output path shown in the uper half of FIG. 13 is approximately 400 picoseconds. The transmit time through the complimentary output paths shown on the lower half of FIG. 13 is approximately 450 picoseconds. Care must be taken in logic package layout and loading to avoid successive type E cell paths with too much load.

Figure 14:
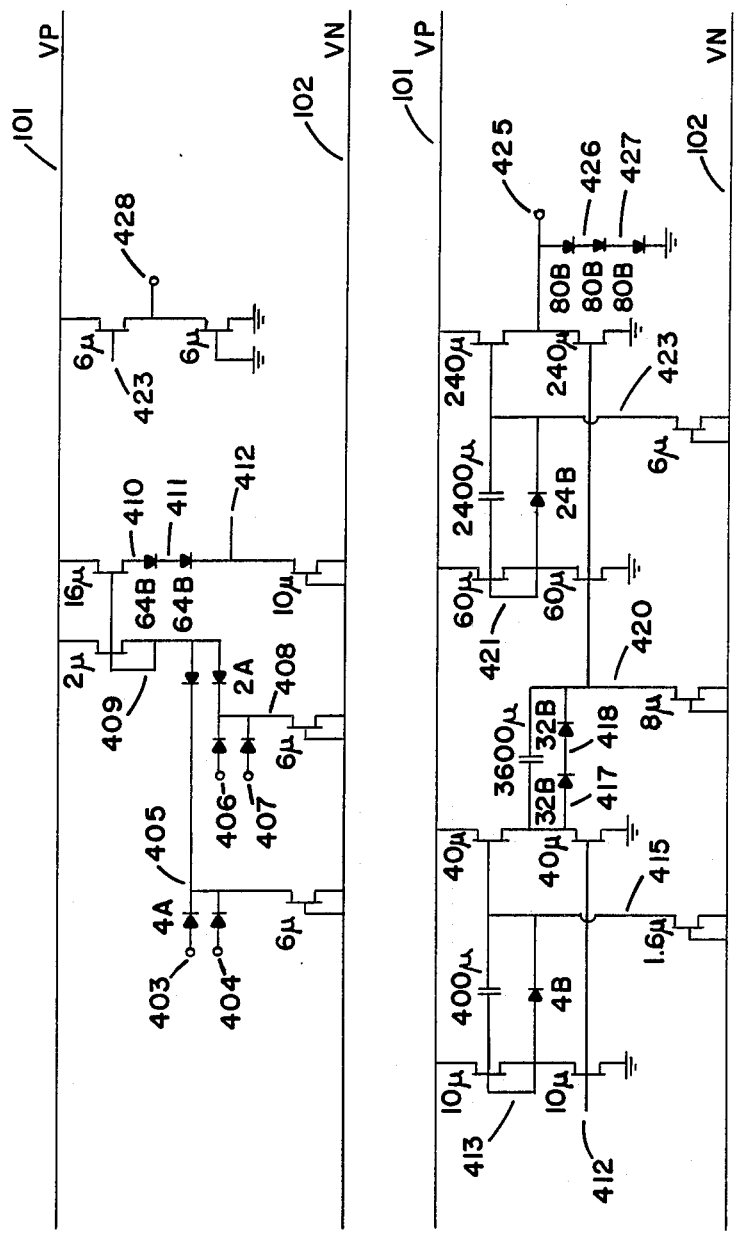
FIG. 14 is an electrical schematic diagram of the cell type F.

The type F package cell in the preferred embodiment of the present invention is used to drive signal lines leaving the integrated circuit die package and traveling to other packages in the system. The structure of the type F cell shown in FIG. 14 is similar to the structure of the type D cell shown in FIG. 12. The main difference is in the size of the load driving transistors (240 micron transistors) in a last stage of the inverting amplifier. The type F cell requires twice the space and twice the power of the type D cell because of the large components involved and fits into two cell locations 500 of FIG. 11.

The impedence of the transmission line from the integrated circuit package through printed circuit boards to a destination package is controlled to be approximately 50 ohms. This transmission line is not terminated with a resistor at the far end. The destination package has some capacitive loading but the amount is generally small enough to be ignored. The transmission line is treated as an open ended line with the destination packages, if more than one, grouped near the end of the line. Signal reflections from the end of the transmission line are as large as the transmitted signal. The reflections traveled back along the transmission path and are terminated at the transmitting type F cell. The type F cell output impedance must be approximately 50 ohms for both logic states to properly source-terminate the transmission line. This is accomplished by sizing the load driving transistors at 240 microns width and by use of the output clamp diodes. The amplitude of the transmitted signal generated by the type F cell is approximately 1200 milivolts. This is half of the signal excursion desired by the receiving package cells. The reflection completes the signal excursion at the far end of the line.

The transmitting type F cell sees a step in the voltage of the output signal from the initial value to the reflected value. The output signal cannot be used internal to the integrated circuit package because the reflected signal takes too long to return. The small circuit in the upper half of the schematic diagram of FIG. 14 is used for a load internal to the integrated circuit package. This internal load is required in most cases because the type F cell is used as a latch and the internal load is required for latch circulation. The output signal 428 produces an on-chip signal that follows the output signal on output 425. To create a latch, output signal 428 is driven into one of the diode inputs 403 or 406 while the clock true and inverted signals are driven into input diode lines 404 and 407 respectively.

Figure 15:
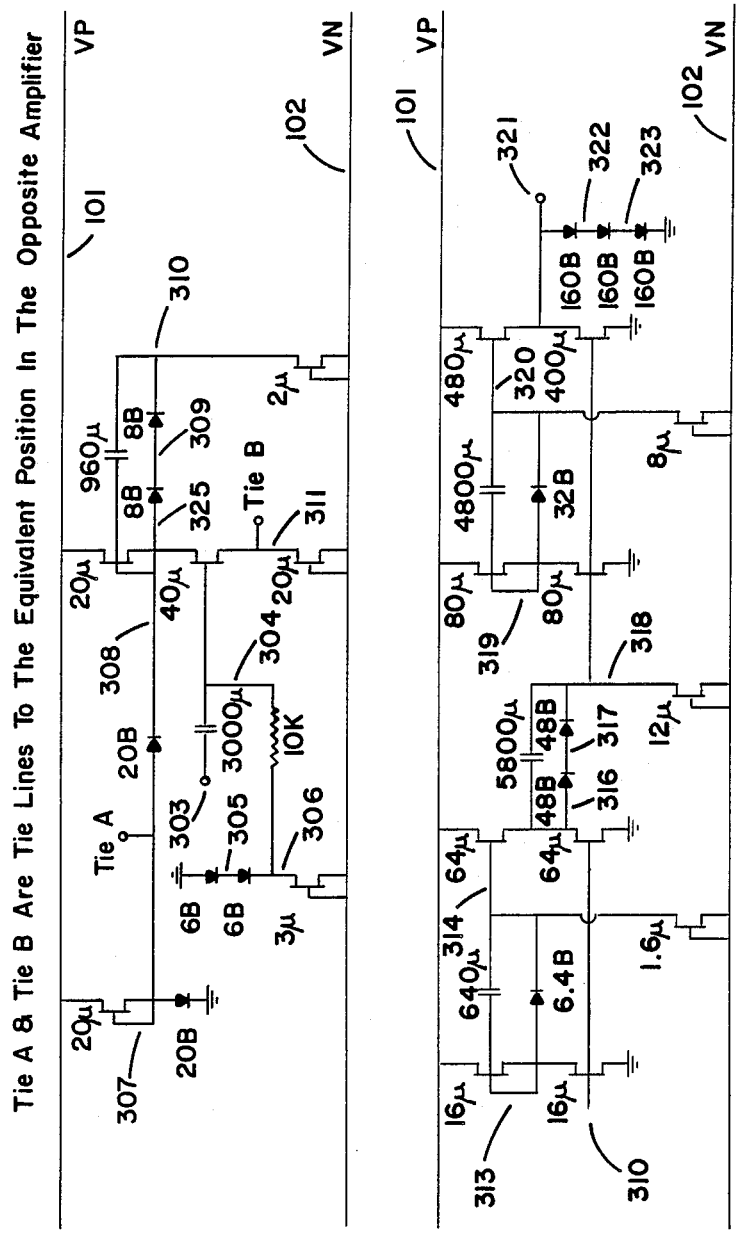
FIG. 15 is an electrical schematic diagram of the cell type CA (clock amplifier).

Each logic package has a clock signal amplifier in addition to the logic package cells. The clock signal amplifier shown in electrical schematic diagram form in FIG. 15 receives differential external clock signals from bonding pads 9 and 11 in the preferred embodiment of the present invention. These bonding pads are assigned this function in all logic package layouts for consistency. Bonding pad 9 provides the normal clock signal input and bonding pad 11 provides the inverted clock signal input. The clock signal amplifier shown in FIG. 15 is located in D street west of FIG. 11 for all logic package layouts. The differential input signals from bonding pads 9 and 11 pass over the power bus and enter the clock signal amplifier circuits from the far ends of D street west. The clock signal amplifier consists of two identical cell designs. These cell designs are designated as type CA in a logic package cell library. Each clock amplifier cell requires four type D cell positions. This means that the clock amplifier completely fills D street west with the two clock amplifier cells. One cell is located on each side of D street west. The points in the schematic diagram of FIG. 15 labeled "Tie A" and "Tie B" cross the street and connect to the equivalent point in the circuit on the opposite side of the street such that the clock amplifiers work together to form a differential clock amplifier.

The clock amplifier circuits shown in FIG. 15 invert three times in each of the cell configurations. The first stage of the amplifier is differentially coupled with the opposite cell. The last two stages are normal inverting amplifiers. The differential first stage is shown in the top section of the circuit schematic diagram in FIG. 15. The last two stages are shown in the bottom section of FIG. 15. The differential first stage amplifier involves a 40-micron current source connected to the power bus 102. Half of this current source is in each cell with tieline B connecting them together. A differential switch with 40-micron transistors then diverts the current from the current source to one side of the amplifier or the other. The crossover point for the switch is when the gate voltages at node 304 in each cell are at −1.4 volts.

The input signals for the differential amplifier are capacitively coupled with a long time constant circuit. The resistor in this circuit is a 10K ohm resistor formed by an implant region in the substrate. The capacitor is a 3000 micron capacitor attached to input node 303. The incoming clock signals are nearly sinusoidal and complimentary. The differential amplifier tends to improve the balance both in the phase relationship and in the amplitude. The voltage at node 311 remains nearly constant at −1.1 volts if the inputs are well balanced.

Each of the clock amplifier cells shown in FIG. 15 has a 20 micron current source connected between the VP power supply bus 101 and node 308. Two microns of this current are diverted into a static level forming circuit for node 310. The remaining 18 microns of current are available for the differential switch. The voltage at node 308 rises to about 2.4 volts when the differential switch is turned on to the other side of the amplifier. This is because of the current source connected to the VP power supply bus 101. As the differential switch passes the crossover point, the 40 micron current from the VN current source quickly overwhelms the 20 micron current source and the voltage at node 308 drops to approximately to 0.1 volts. At this voltage the clamp to node 307 absorbs the remaining 22 microns of current and the node 308 voltage stabilizes. The output signal from the differential first stage of the clock amplifier therefore swings from approximately 0.1 volts to approximately 2.4 volts at node 308. A level shifting circuit changes the static level of the signal to approximately −1.2 volts to approximately 0.8 volts. The difference in the total voltage swing is the result of voltage compression in the level shifting circuit.

The remainder of the clock signal amplifier design is similar to the logic cell designs. There are two stages of inverting amplifiers as previously described. Note that the load driving transistors for the last stage of the clock amplifier shown in FIG. 15 are not symmetrical in value. This is because the clock signal amplifier sees a considerable static load in driving the logic cells in the integrated circuit package. This load varies from 0 to 240 microns of current source to the VN power supply bus 102. The extra 80 microns of current source follower size is to correct for the average static load.

A cell library is constructed from the four basic cell types described above. The type CA or clock amplifier cell is only used for buffering the incoming two-phase 500 MHz clock. The remaining three cell types are configured to have a variety of logical input stages to create various cell subtypes as described below. The diode configurations on cell types are as follows.

| Cell Type D | Cell Type E | Cell Type F |
|---|---|---|
| DA 5 | EA 5 | FA 5 |
| DB 5 × 5 | EB 5 × 5 | FB 5 × 5 |
| DC 5 × 5 × 4 | EC 5 × 5 × 4 | FC 5 × 5 × 4 |
| DD 4 × 3 × 3 × 3 | ED 5 × 5 × 4 × 4 | FD 5 × 5 × 4 × 4 |
| | EE 5 × 5 × 4 × 4 × 2 | FE 5 × 5 × 4 × 4 × 2 |

The above diode configurations for the front end on the cell types are configured in AND-OR logic arrangements. Latches are constructed by forming a feedback path from an output of the cell type to one of the input lines. The true and complimented values of the clocks are then used on others of the diode inputs to form a latch configuration. Eighty percent of the cell types used throughout the design of the CRAY-3 machine are clocked cell types which not only perform a logical function but also latch and hold that function until the next clock cycle at a clock speed of 2 nanoseconds.

Figure 16:
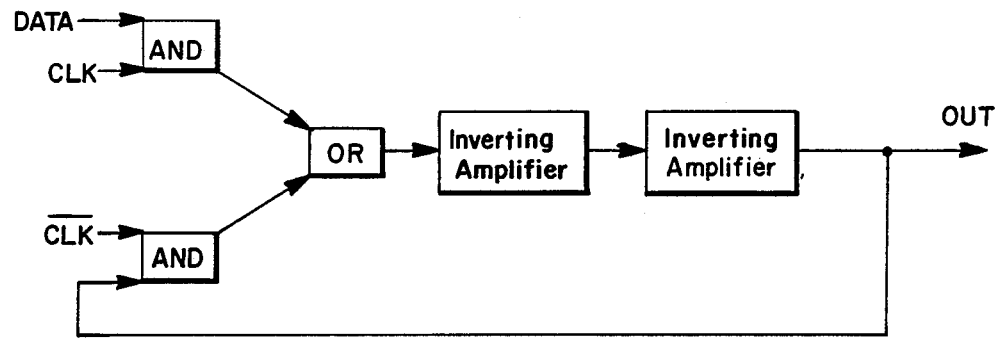
FIG. 16 shows a type D cell configured as a latch.

An example of a typical latch configuration shown in logical form is shown in FIG. 16. This is a type D cell configured as a latch. However, those skilled in the art will readily recognize that the type E cells and the type F cells can also be configured as latches. The two-phase clock designated as CLK and $\overline{CLK}$ is used for controlling the latch such that when the CLK signal is active, the output follows the data input, and when the $\overline{CLK}$ signal is active, the output holds the last signal appearing when the clock changed. Thus, the latch configuration of FIG. 16 is a gated latch type such that the output is held on the falling clock edge of the CLK signal. Those skilled in the art will recognize that the CLK and $\overline{CLK}$ clock signals can be interchanged when controlling the latch of FIG. 16 so that the latch captures data on the falling edge of the $\overline{CLK}$ signal. In this fashion, a latch clocked on the falling edge of the CLK signal followed by a latch clocked on the falling edge of the $\overline{CLK}$ signal provides for a 1-nanosecond timing delay between the latches.

Figure 17:
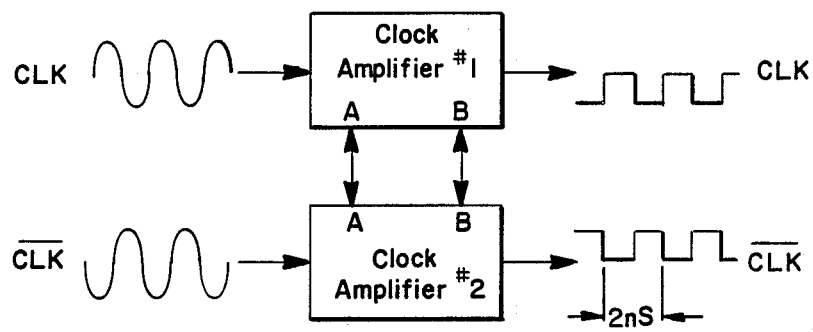
FIG. 17 shows the use of the clock amplifier cell types to produce a phase-corrected differential clock signal for on-chip clocking of latches of the type shown in FIG. 16.

The aforementioned latch design operates in an extremely fast environment when implemented in the gallium arsenide integrated circuits using the preferred cell types described above. The propagation delay through a typical type D cell latch shown in FIG. 16 is approximately 400 picoseconds. The latch of FIG. 16 is clocked by the two-phase clock signal operating at 500 MHz. In order to ensure proper operation of the latch shown in FIG. 16, the CLK and $\overline{CLK}$ signals must be nearly perfect in their out-of-phase relationship. This 180° out-of-phase relationship is ensured by the clock amplifier cells configured to phase correct the clock signal using a differential amplification scheme shown in FIG. 17. The incoming clock signal is a 500 MHz sinusoidal differential clock signal simultaneously applied to clock amplifier No. 1 and clock amplifier No. 2. The resulting output is a pair of square waves designated CLK and $\overline{CLK}$ operating at 180° out of phase with a period of 2 nanoseconds. By correctly and accurately controlling the phase relationship between the CLK and $\overline{CLK}$ signals, an extremely fast and efficient clocking scheme for the latch type shown in FIG. 16 is possible. The resulting highly synchronous logic design allows for high-speed latching of logical decisions with a minimum of propagation delay. In this fashion, up to eight levels of logical decisions can be performed between latches, all within a 2-nanosecond span of time or a minimum delay time between latches can be compressed to 1 nanosecond.

While the present invention has been described in connection with the preferred embodiment thereof, it will be understood that many modifications will be readily apparent to those of ordinary skill in the art, and this application is intended to cover any adaptations or variations thereof. Therefore, it is manifestly intended that this invention be limited only by the claims and the equivalents thereof.

What is claimed is:

1. A gallium arsenide depletion mode MESFET logic cell, comprising:
   a diode logic section operable for performing a voltage-switch logical decision and operable for producing a translated logical result;
   a voltage level shift section connected to said diode logic section operable for level shifting said logical result;
   at least one amplifier section connected to said level shift section operable for producing a voltage-switch output signal;
   said amplifier section further includes:
      an inverter section connected to said level shift section operable for inverting the level-shifted logical result;
      a second level shifting section connected to said inverter section and operable for capacitively coupling said logical result to an output section; and
      said output section connected to said second level shifting section and having load driving transistors for amplifying the logical result to produce said voltage-switch output signal.

2. The logic cell according to claim 1 further including additional amplifier sections capacitively connected to said at least one amplifier section such that said voltage-switch output signal is further amplified and inverted.

3. A gallium arsenide depletion mode MESFET integrated circuit, comprising:
 a plurality of digital logic cells selected from a cell library and fabricated in a single gallium arsenide substrate;
 said cells being placed at a plurality of predefined locations on said substrate;
 a plurality of bonding pads placed on said substrate for sourcing and receiving logical signals;
 a plurality of metal interconnect lines placed within predefined route channels on said substrate for interconnecting said cells and for connecting said cells to said bonding pads;
 said metal interconnect lines further placed for supplying power to said cells; and
 a high-speed clock distribution network comprising:
  a two-phase clock input on said substrate;
  a differential clock amplifier connected to said clock input for phase correcting and amplifying said two-phase clock; and
  a clock distribution interconnect connected for supplying said phase corrected two-phase clock to preselected cells within said integrated circuit.

4. The integrated circuit according to claim 3 wherein said two-phase clock has an operational frequency of at least 900 MHz.

5. A method of designing custom gallium arsenide LSI integrated circuits, comprising the steps of:
 (a) selecting a plurality of cells from a cell library;
 (b) placing said cells at predefined locations on a gallium arsenide substrate;
 (c) placing at predefined locations within the gallium arsenide substrate a differential clock amplifier cell for phase correcting and amplifying a two-phase high-speed clock; and
 (d) interconnecting said cells and said clock amplifier with first and second metal layers to form a high-speed highly synchronous custom logic function.

6. A method of performing a logic function in a gallium arsenide D-MESFET cell, comprising the steps of:
 (a) performing a logical decision on a plurality of voltage-switch signals applied to the input of a diode network;
 (b) translating said logical decision into a resultant signal;
 (c) shifting the level of said resultant signal to produce a negative level shifted signal;
 (d) inverting said level shifted signal to produce an inverted signal; and
 (e) amplifying said inverted signal.

7. A gallium arsenide D-MESFET differential clock amplifier, comprising:
 two identical clock amplifier cells connected together and operable for receiving a first and second high-speed clock signals having a frequency greater than 900 MHz;
 said clock amplifier cells further operable for correcting the phase relationship between said first and second high-speed clock signals and producing a first high-speed on-chip clock signal and a second high-speed on-chip clock signal having a phase relationship 180 ° different from said first high-speed on-chip clock signal;
 said clock amplifier cells further operable for amplifying said first and second high-speed on-chip clock signals; and
 each of said identical clock amplifier cells comprising:
  a capacitively coupled input stage for receiving one of said high-speed clock signals;
  first amplifier stage connected to said input stage and differentially coupled to the opposite clock amplifier cell to form a differential switch; and
  second amplifier stage connected to said first amplifier stage and operable for inverting and amplifying said high-speed clock.

8. A gallium arsenide D-MESFET synchronous logic design, comprising:
 a gated latch having a logic decision input stage and an amplifying output stage for producing an output signal with said output signal being fed back to said input stage;
 a first and second phase clock signals driving said input stage for controlling said latch; and
 a differential clock amplifier operable for phase correcting an input clock control signal and for producing said first and second phase clock signals such that said clock signals are 180° out of phase.

9. A structured gallium arsenide digital logic integrated circuit, comprising:
 a plurality of digital logic package cells fabricated in a gallium arsenide substrate arranged in a fixed pattern of predefined locations;
 vertical route channel means including a central route channel oriented in a north-south reference direction for placement of n metal interconnect lines forming electrical connections between metal interconnect lines of horizontal route channel means and a plurality of signal inputs;
 said horizontal route channel means including a plurality of secondary route channels extending from both sides of said central route channel and oriented in east-west reference directions for placement of m metal interconnect lines forming electrical connections between said cells, said metal interconnect lines of said vertical route channel means and a plurality of signal outputs;
 voltage bus means including a power distribution grid connected to said cells for supplying power to said cells;
 a plurality of bonding pads placed around the periphery of said gallium arsenide substrate, said bonding pads including input bonding pads connected to said signal inputs, output bonding pads connected to said signal outputs and power bonding pads connected to said power distribution grid; and
 said cells being arranged on the north and south sides of said secondary route channels.

10. The structured gallium arsenide digital logic integrated circuit according to claim 9 wherein said input bonding pads are located only at the north or south ends of said vertical route channel means and wherein said output bonding pads are located on the east or west ends of said horizontal route channel means.

11. The structured gallium arsenide digital logic integrated circuit according to claim 10 wherein said electrical connections between said metal interconnect lines of said horizontal route channel means and said signal inputs is formed only through the north or south ends of said vertical route channel means and wherein said electrical connections between said cells and said signal outputs is formed only through the east or west ends of said horizontal route channel means.

12. The structured gallium arsenide digital logic integrated circuit according to claim 11 wherein said metal interconnect lines comprise multiple layers of metal having a plurality of levels.

13. The structured gallium arsenide digital logic integrated circuit according to claim 12 wherein m is less than n.

14. The structured gallium arsenide digital logic integrated circuit according to claim 9 further including a differential clock amplifier cell placed at a central predefined location for phase correcting and amplifying a two-phase high speed clock.

15. The structured gallium arsenide digital logic integrated circuit according to claim 10 wherein said voltage bus means further includes:
   first layer metal power distribution paths including:
      at least one longitudinal first voltage bus place on at least one side of the integrated circuit and oriented in a north-south reference direction;
      at least one longitudinal second voltage bus, located adjacent to said first voltage bus;
      at least one longitudinal third voltage bus, located adjacent to said second voltage bus; and
      a plurality of first voltage paths oriented in an east-west reference direction connected between said first voltage bus and said digital logic package cells;
   second layer metal power distribution paths including:
      a plurality of second voltage paths connected between said second voltage bus and said digital logic package cells and oriented in an east-west reference direction; and
      a plurality of third voltage paths connected between said third voltage bus and said digital logic package cells and oriented in an east-west reference direction.

16. The structured gallium arsenide digital logic integrated circuit according to claim 15, further including:
   said first voltage paths being located between said predefined locations of said cells and terminate at said central route channel;
   said second voltage paths being located above said first voltage paths and which terminate at said central route channel; and
   said third voltage paths being placed within said horizontal route channel means and which terminate at said central route channel.

17. The structured gallium arsenide digital logic integrated circuit according to claim 16 wherein one of said voltage buses is a reference voltage.

18. The structured gallium arsenide digital logic integrated circuit according to claim 17 wherein said first voltage is a ground connection, said second voltage is a positive voltage, and said third voltage is a negative voltage.

19. The structured gallium arsenide digital logic integrated circuit according to claim 9, wherein said logic package cells comprise gallium arsenide depletion mode MESFET logic cells, including:
   a diode logic section operable for performing a voltage-switch logical decision and operable for producing a translated logical result;
   a voltage level shift section connected to said diode logic section operable for level shifting said logical result;
   at least one amplifier section connected to said level shift section operable for producing a voltage-switch output signal;
   said amplifier further includes:
      an inverter section connected to said level shift section operable for inverting the level-shifted logical result;
      a second level shifting section connected to said inverter section and operable for capacitively coupling said logical result to an output section; and
      said output section connected to said second level shifting section and having load driving transistors for amplifying the logical result to produce said voltage-switch output signal.

20. A method of fabricating a structured gallium arsenide digital logic integrated circuit, comprising the steps of:
   reserving a main vertical route channel area;
   reserving a plurality of horizontal route channel areas on both sides of said main vertical route channel area;
   fabricating a plurality of gallium arsenide digital logic cells at a plurality of predefined locations positioned on both sides of said horizontal route channel areas;
   fabricating a differential clock amplifier cell at a central predefined location for phase correcting and amplifying a two-phase high speed clock;
   fabricating a power grid structure for supplying power to said logic package cells;
   placing bonding pads around periphery of said logic package power grid structure for sourcing and receiving logical signals and for receiving power for said power grid structure;
   placing m horizontal metal interconnect lines within said horizontal route channel area;
   placing n vertical metal interconnect lines within said main vertical route channel area;
   connecting said horizontal metal interconnect lines with said logic cells and said bonding pads; and
   connecting said vertical metal interconnect lines with said horizontal metal interconnect lines and with said bonding pads.

* * * * *